(12) United States Patent
Brower et al.

(10) Patent No.: US 12,348,024 B2
(45) Date of Patent: Jul. 1, 2025

(54) ARC FAULT DETECTION THROUGH MIXED-SIGNAL MACHINE LEARNING AND NEURAL NETWORKS

(71) Applicant: Hubbell Incorporated, Shelton, CT (US)

(72) Inventors: John Edward Brower, Fairfield, CT (US); Brian S. Chia, Cheshire, CT (US); Wenjing Chen, Newton, CT (US)

(73) Assignee: Hubbell Incorporated, Shelton, CT (US)

( * ) Notice: Subject to any disclaimer, the term of this patent is extended or adjusted under 35 U.S.C. 154(b) by 164 days.

(21) Appl. No.: 18/106,854

(22) Filed: Feb. 7, 2023

(65) Prior Publication Data

US 2023/0307900 A1    Sep. 28, 2023

Related U.S. Application Data

(60) Provisional application No. 63/307,392, filed on Feb. 7, 2022.

(51) Int. Cl.
*H02H 1/00* (2006.01)
*G01R 31/52* (2020.01)

(52) U.S. Cl.
CPC ........ *H02H 1/0092* (2013.01); *H02H 1/0015* (2013.01); *G01R 31/52* (2020.01)

(58) Field of Classification Search
CPC ...... H02H 1/00; H02H 1/0092; H02H 1/0015; H02H 3/00; H02H 3/16; H02H 3/02; H02H 3/50; G06N 20/00; G06N 5/00; G01R 31/52

USPC .................................................. 361/42–50
See application file for complete search history.

(56) References Cited

U.S. PATENT DOCUMENTS

| | | |
|---|---|---|
| 2010/0157486 A1* | 6/2010 | Parker .................. H02H 1/0015 361/2 |
| 2018/0083434 A1 | 3/2018 | Lim et al. |
| 2019/0339319 A1 | 11/2019 | Jakupi |
| 2019/0363531 A1 | 11/2019 | Ostrovsky |
| 2020/0035425 A1 | 1/2020 | Brower |
| 2020/0036183 A1 | 1/2020 | Miller, III |

(Continued)

OTHER PUBLICATIONS

International Search Report and Written Opinion mailed in Application No. PCT/US2023/012517, dated Jun. 26, 2023.

*Primary Examiner* — Danny Nguyen
(74) *Attorney, Agent, or Firm* — Michael Best & Friedrich LLP

(57) ABSTRACT

A circuit interrupting device including a line terminal, a wideband current sensor configured to measure a current flowing through the line terminal, a zero cross detection circuit configured to measure a voltage and frequency of the line terminal, and a microcontroller including an electronic processor. The microcontroller is configured to apply a digital filter to a line current measurement signal received from the wideband current sensor and estimate spectral density of the filtered line current measurement signal. The microcontroller is further configured to calculate an arcing characteristic based on the spectral density, determine whether an arc fault is present within the circuit interrupting device based on a comparison of the arcing characteristic to one or more thresholds, and activate an interrupting device when an arc fault is present.

22 Claims, 18 Drawing Sheets

(56) References Cited

U.S. PATENT DOCUMENTS

| | | | |
|---|---|---|---|
| 2022/0373612 A1* | 11/2022 | Tharmakulasingam | ................. G06N 3/045 |
| 2023/0053431 A1* | 2/2023 | Zhang | ................. G06N 20/00 |

* cited by examiner

ARC FAULT DETECTION THROUGH MIXED-SIGNAL MACHINE LEARNING AND NEURAL NETWORKS

RELATED APPLICATIONS

This application claims the benefit of U.S. Provisional Patent Application No. 63/307,392, filed Feb. 7, 2022, the entire content of which is hereby incorporated by reference.

FIELD

The present disclosure relates generally to switched electrical devices. More particularly, the present disclosure is directed to circuit interrupting devices, such as arc fault circuit interrupter (AFCI) devices, that change to a "tripped" or unlatched state from a "reset" or latched state when one or more conditions are detected.

SUMMARY

A first aspect of the present disclosure provides a circuit interrupting device including a line terminal, a wideband current sensor configured to measure a current flowing through the line terminal, a zero cross detection circuit configured to measure a voltage and frequency of the line terminal, and a microcontroller including an electronic processor. The microcontroller is configured to apply a digital filter to a line current measurement signal received from the wideband current sensor and estimate spectral density of the filtered line current measurement signal. The microcontroller is further configured to calculate an arcing characteristic based on the spectral density, determine whether an arc fault is present within the circuit interrupting device based on a comparison of the arcing characteristic to one or more thresholds, and activate an interrupting device when an arc fault is present.

Another aspect of the present disclosure provides a method of detecting the presence of an arc fault occurring within a circuit including a line terminal. The method includes measuring, with a wideband current sensor, a current flowing through the line terminal, applying, by a microcontroller including an electronic processor, a digital filter to a line current measurement signal received from the wideband current sensor, and estimating, by the microcontroller, a spectral density of the filtered line current measurement signal. The method further includes calculating, by the microcontroller, an arcing characteristic based on the spectral density, determining, by the microcontroller, whether an arc fault is present within the circuit based on a comparison of the arcing characteristic to one or more thresholds, and activating, by the microcontroller, an interrupting device when an arc fault is present.

Another aspect of the present disclosure provides a system including a circuit interrupting device and an external device. The circuit interrupting device includes a line terminal, a wideband current sensor configured to measure a current flowing through the line terminal, and a communication circuit configured to wirelessly transmit a signal including current measurements taken by the wideband current sensor. The external device includes a second communication circuit configured to wirelessly received the signal and a controller including an electronic processor. The controller is configured to estimate a spectral density of the current measurements, calculate at least one arcing characteristic associated with the spectral density, develop a machine learning model based on the spectral density and at least one arcing characteristic, and deploy the machine learning module to the circuit interrupting device.

Another aspect of the present disclosure provides a method of deploying a machine learning model to a circuit interrupting device. The method includes receiving, by a communication circuit, a first set of line current measurements that were taken when an arc fault was present, receiving, by the communication circuit, a second set of line current measurements that were taken when an arc fault was not present, estimating, by a controller including an electronic processor, a first spectral density of the first set of line current measurements, and estimating, by the controller, a second spectral density of the second set of line current measurements. The method further includes calculating, by the controller, a first set of arcing features associated with the first spectral density, calculating, by the controller, a second set of non-arcing features associated with the second spectral density, executing, by the controller, a training algorithm to create the machine learning model based on the first set of arcing features and the second set of non-arcing features, and deploying the machine learning model to the circuit interrupting device.

Another aspect of the present disclosure provides a circuit interrupting device including a line terminal, a wideband current sensor configured to measure a current flowing through the line terminal, and a microcontroller including an electronic processor. The microcontroller is configured to estimate a spectral density of a line current measurement taken by the wideband current sensor, calculate an arcing feature based on the spectral density, and calculate, by executing an inference algorithm, a probability of an arc fault occurring based on the arcing feature and the spectral density. The microcontroller is further configured to set a first flag when the probability exceeds a threshold for a first amount of time and activate an interrupting device when the first flag is set.

Another aspect of the present disclosure provides a method of detecting the presence of an arc fault occurring within a circuit including a line terminal. The method includes measuring, with a wideband current sensor, a current flowing through the line terminal, estimating, by the microcontroller, a spectral density of a line current measurement signal generated by the wideband current sensor, and calculating, by the microcontroller, an arcing feature based on the spectral density. The method further includes calculating, by executing an inference algorithm, a probability of an arc fault occurring based on the arcing feature and the spectral density, setting a first flag when the probability exceeds a threshold for a first amount of time, and activating an interrupting device when the first flag is set.

Other aspects of the application will become apparent by consideration of the detailed description and accompanying drawings.

DETAILED DESCRIPTION

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

Figure 1A:
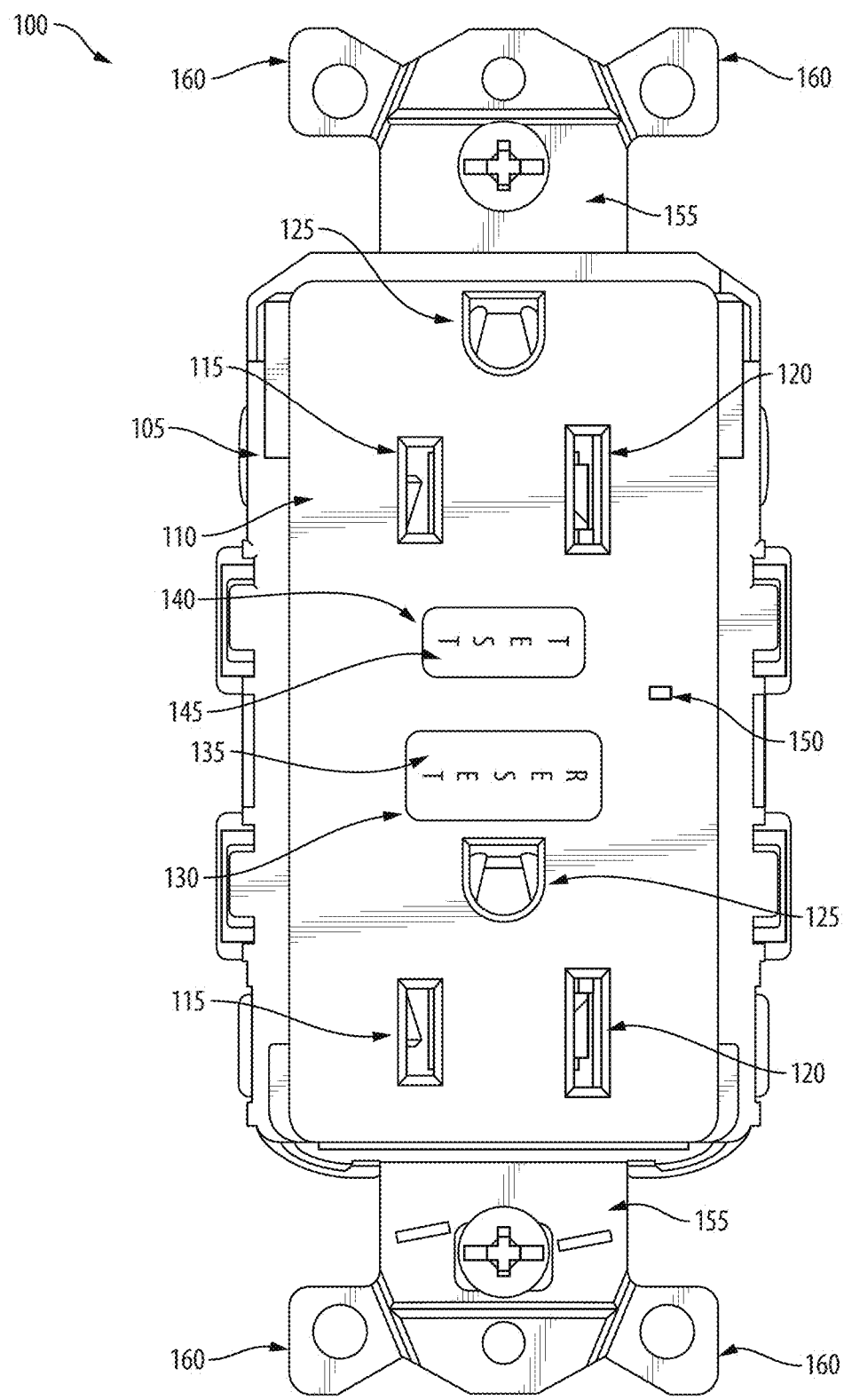
FIG. 1A illustrates a perspective view of an AFCI device, or AFCI receptacle, according to some embodiments.

FIG. 1A illustrates a frontal view of an AFCI device, or AFCI receptacle, 100 according to some embodiments of the present disclosure. The AFCI receptacle 100 includes a front cover 105 having a duplex outlet face 110 with a phase, or hot, opening 115, a neutral opening 120, and a ground opening 125. The face 110 further has opening 130, accommodating a RESET button 135, an adjacent opening 140, accommodating a TEST button 145, and one or more additional openings 150. In some embodiments, the one or more additional openings 150 accommodate indicators, such as but not limited to, various colored light-emitting diodes (LEDs). In some embodiments, the one or more additional openings 150 accommodate bright LEDs used, for example, as a nightlight. In some embodiments, the one or more additional openings 150 accommodate a photoconductive photocell used, for example, to control the nightlight LEDs. In some embodiments, the one or more additional openings 150 provide access to a set screw for adjusting a photocell device or a buzzer in accordance with this, as well as other, embodiments. The AFCI receptacle 100 also includes a rear cover (not shown or enumerated) that is secured to the front cover 105 by a plurality of fasteners (not shown or enumerated) and a ground yoke/bridge assembly 155. The ground yoke/bridge assembly 155 includes standard mounting ears 160 that protrude from ends of the receptacle 100.

Figure 1B:
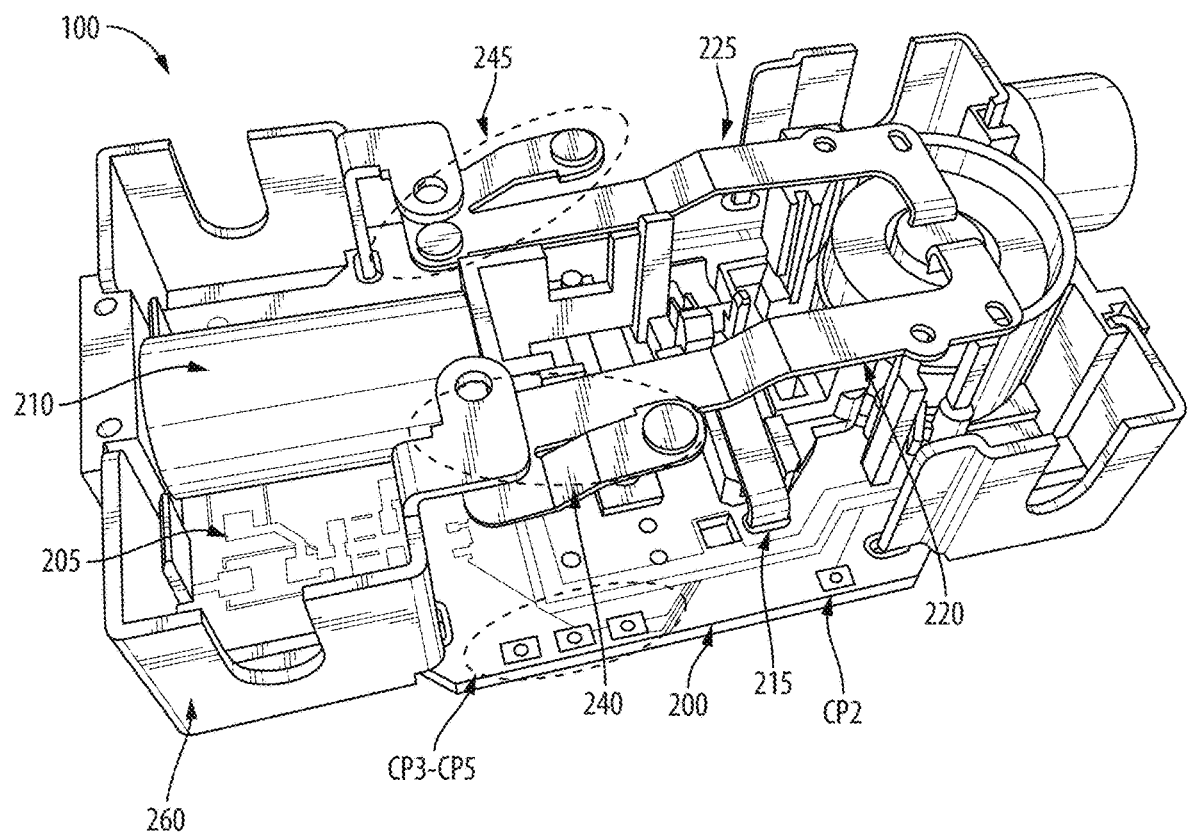
FIG. 1B illustrates a perspective view of the AFCI receptacle of FIG. 1A with a front cover removed to expose a primary printed circuit board (PCB), according to some embodiments.
Figure 2:
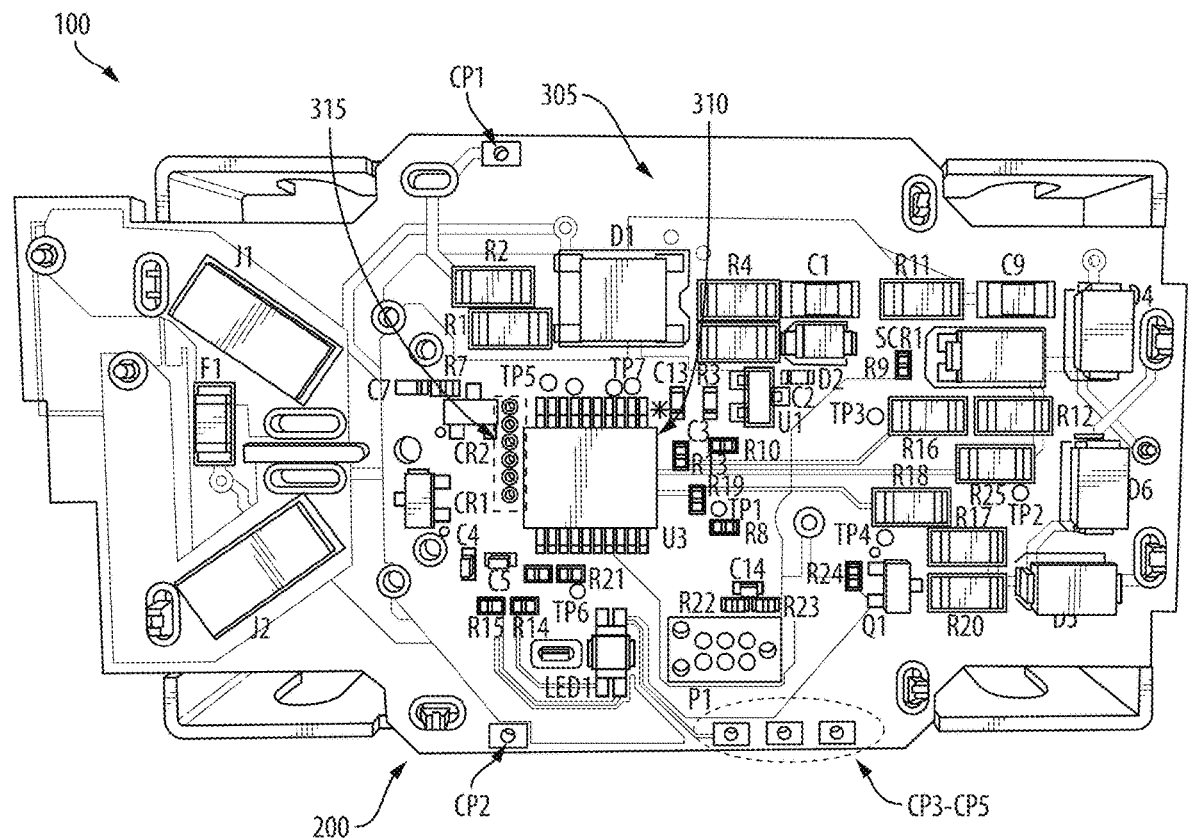
FIG. 2 illustrates a perspective view of the primary PCB of FIG. 1B, according to some embodiments.
Figure 3:
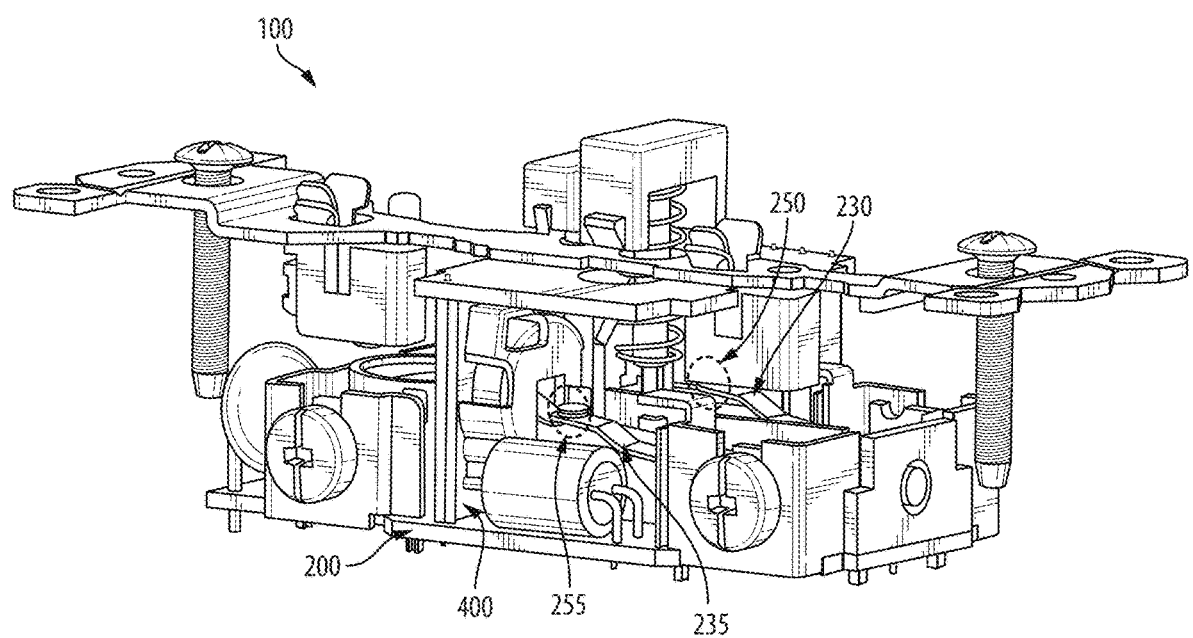
FIG. 3 illustrates a perspective view of the AFCI receptacle of FIG. 1A with a front cover removed to expose a secondary PCB, according to some embodiments.

FIGS. 1B-3 illustrate perspective views of the AFCI receptacle 100 in which the front cover 105, rear cover, and other components have been removed to expose a primary printed circuit board (PCB), or primary board, 200 according to some embodiments. In some embodiments, the primary board 200 provides control and physical support for most of the working components included in the AFCI receptacle 100. For example, as shown in FIG. 1B, a top surface 205 of the primary board 200 provides support for a solenoid or, interrupting device, 210. The top surface 205 further supports cantilevered phase and neutral line contact arms 220, 225 and phase and neutral load contact arms 230, 235 (FIG. 3). The respective distal ends of the line contact arms 220, 225 support the phase and neutral line contacts 240, 245. Likewise, the respective distal ends of the load contact arms 230, 235 support the phase and neutral load contacts 250, 255 (FIG. 3). The resiliency of the cantilevered line contact arms 220, 225 biases the line contacts 240, 245 away, or separated, from the load contacts 250, 255. The load contact arms 230, 235 extend from a movable contact carriage 260, which is constructed from an insulating material.

As shown in FIG. 2, the primary board 200 further includes a bottom surface 305 that provides physical and operational support for many of the control electronics included in the AFCI receptacle 100. For example, the bottom surface 305 supports a controller 310 and one or more slots, or interfaces, 315 for receiving connection. The controller 310 is as an integrated circuit device, such as a Microchip microcontroller. However, in other embodiments, the controller 310 is implemented as another type of processor-based control device. The controller 310, which includes a memory and an electronic processor, may be configured to control various operations of the AFCI receptacle 100. For example, in some embodiments, the controller 310 is configured to detect the occurrence of an arc fault. In some embodiments, primary board 200 includes additional communication interfaces CP1-CP5, which may also be referred to as compliant pins.

Figure 4:
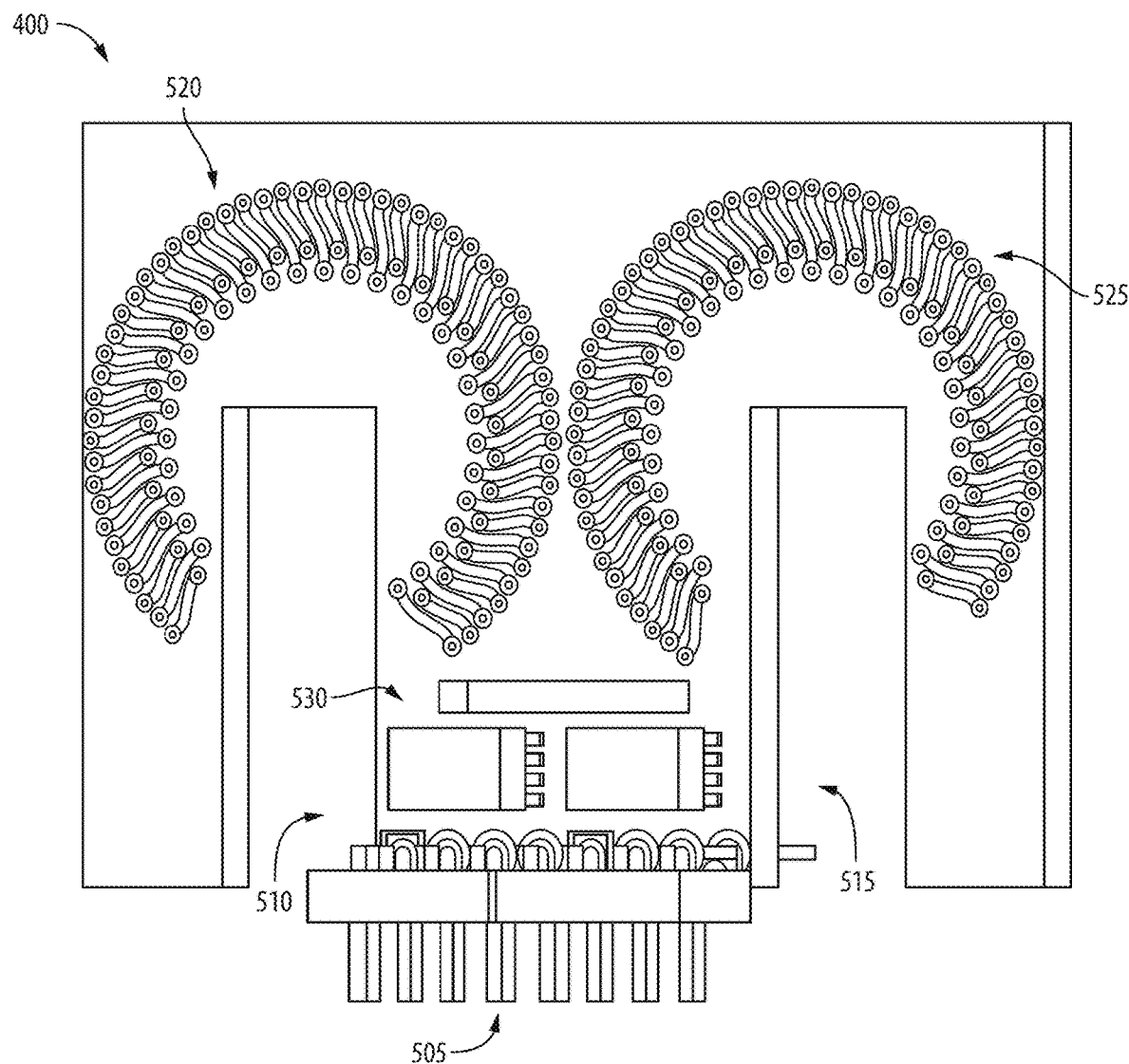
FIG. 4 illustrates a perspective view of the second PCB of FIG. 3, according to some embodiments of the application.

In some embodiments, the AFCI receptacle 100 includes one or more additional PCBs that provide physical and operational support for one or more additional control electronics included in the AFCI receptacle 100. For example, as shown in FIGS. 3 and 4, the AFCI receptacle 100 may include a second PCB, or secondary board, 400 that is used to detect the occurrence of an arc fault. The secondary board 400 may be connected to the primary board 200, for example, by one or more pins 505. In some embodiments, the pins 505 include one or more serial communication pins used for transferring data signals between the primary and secondary boards 200, 400. For example, the pins 505 may include one or more serial-peripheral interface (SPI) pins configured for linking communication between the primary board 200 and the second board 400. In some embodiments, the pins 505 further include one or more power pins used for transferring power between the primary and secondary boards 200, 400. In some embodiments, pins 505 are received by interfaces 315 of the primary board 200. In some embodiments, pins 505 are connected to interfaces CP1-CP5 of the primary board 200. In addition, first and second apertures 510, 515 are formed in the secondary board 400 and are respectively arranged to receive the line contact arms 220, 225. In some embodiments, the first aperture 510 is configured to receive the phase line contact arm 220, while the second aperture 515 is configured to receive the neutral line contact arm 225.

As shown in FIG. 4, the secondary board 400 may be implemented as an AFCI module that includes one or more circuit components used for detecting the presence of an arc fault within the AFCI receptacle 100 and/or the circuit to which the AFCI receptacle 100 is connected. In such embodiments, as shown in FIG. 4, the secondary board 400 includes one or more wideband current sensors, such as first and second coils 520, 525. In some embodiments, the first and second coils 520, 525 are embedded in the secondary board 400 and respectively include first and second coil apertures. In some embodiments, the first coil aperture is configured to receive the phase line contact arm 220, whereas the second coil aperture is configured to receive the neutral line contact arm 225. In some embodiments, the first and second coils 520, 525 are implemented as Rogowski coils. In some embodiments, the first and second coils 520, 525 are implemented as other types of coils.

In some embodiments, the secondary board 400 further includes an arc fault detection circuit 530, which includes one or more electrical components used to detect the occurrence of an arc fault. For example, the arc fault detection circuit 530 may include a bandpass filter, an analog-to-digital converter (ADC), an integrator, a gain stage, or scaling module, a resonator and/or a time-domain correlator. In some embodiments, the secondary board 400 does not include its own controller. In such embodiments, the controller 310 is configured to determine whether an arc fault is present based on data received from the arc fault detection circuit 530. In some embodiments, the arc fault detection circuit 530 includes its own controller that is configured to control operation of the components included in arc fault detection circuit 530. In such embodiments, the arc fault detection circuit 530 is configured to perform a plurality of functions related to detecting the occurrence of an arc fault. The controller included in arc fault detection circuit 530 may be implemented as the same type of controller as controller 310. However, in some embodiments, controller included in detection circuit 530 is implemented as some other type of microcontroller.

In some embodiments, the AFCI receptacle 100 does not include a secondary board 400. In such embodiments, the first and second coils 520, 525 and the arc fault detection circuit 530 are supported by the primary board 200. Accordingly, in such embodiments, the controller 310 is configured to determine whether an arc fault is present.

Figure 5A:
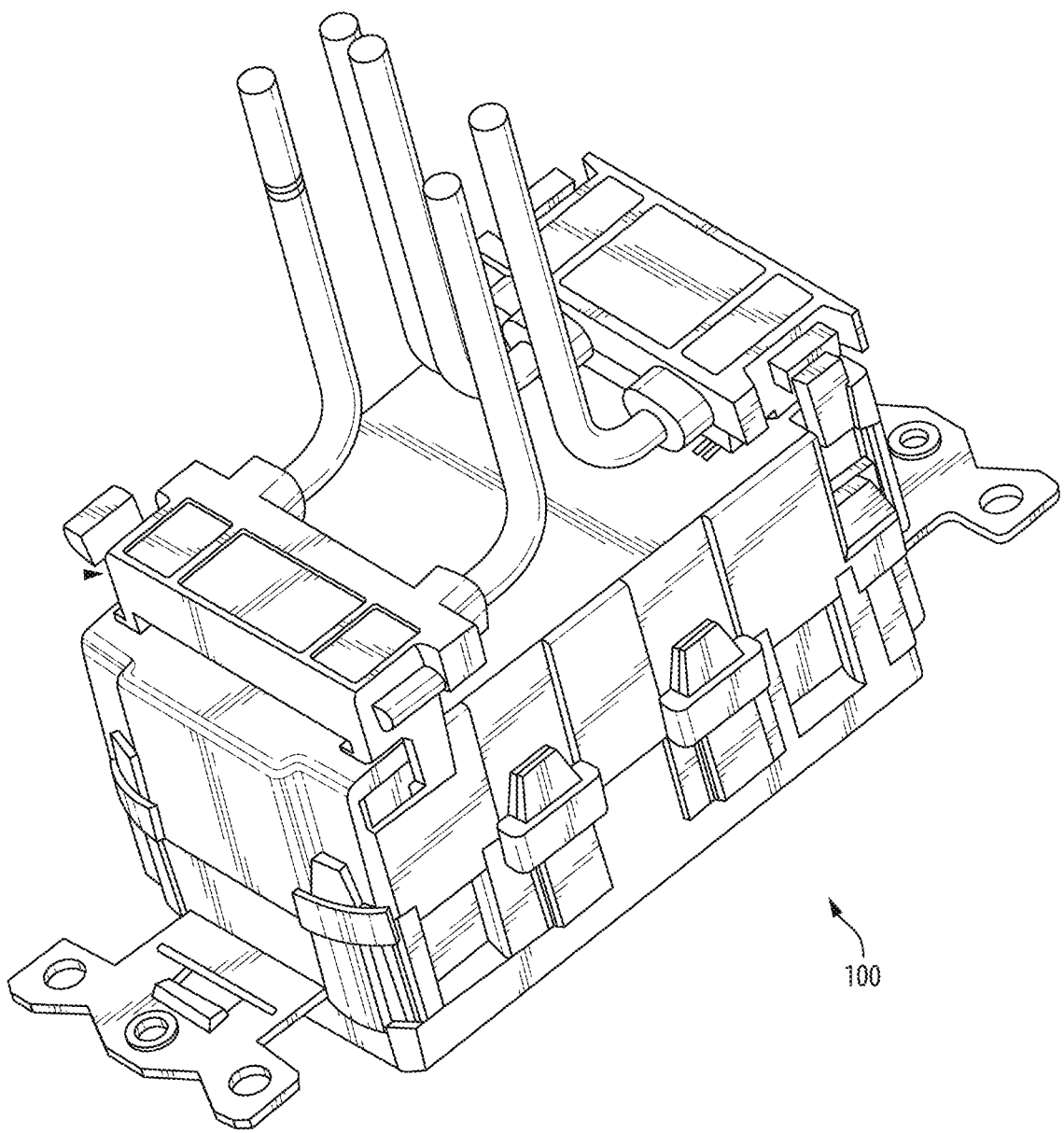
FIGS. 5A and 5B illustrate perspective views of an AFCI receptacle, according to some embodiments.
Figure 5B:
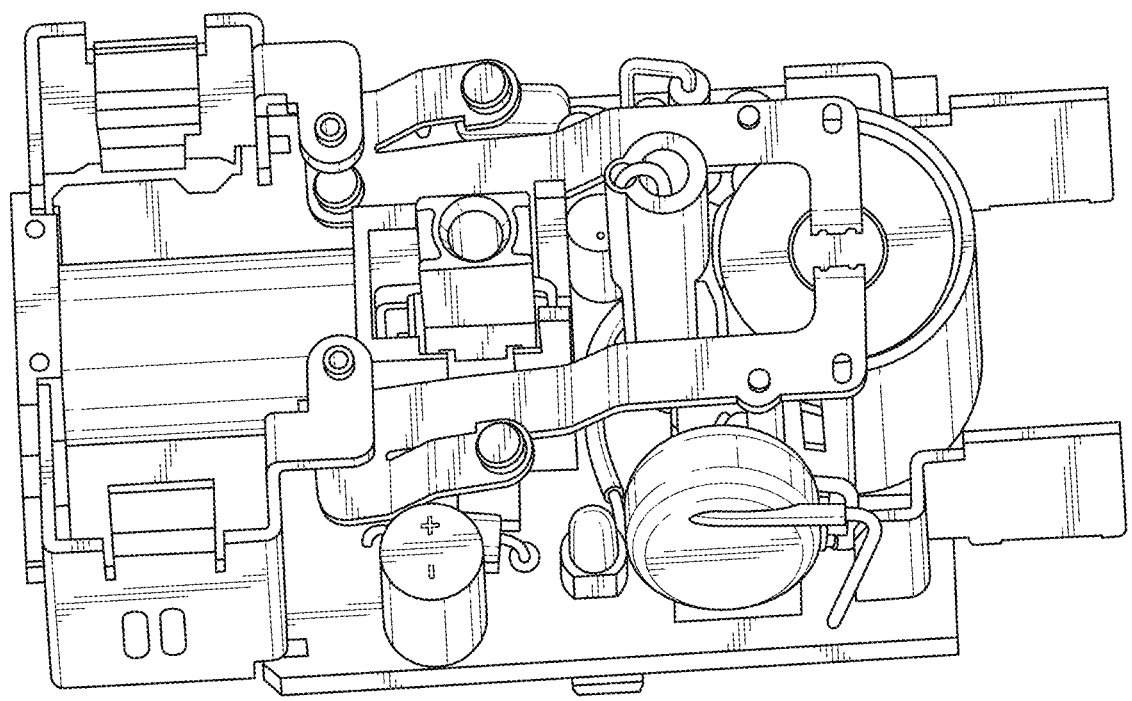

Although illustrated in FIG. 3 as including terminal screws configured for receiving power from an external power source and/or providing power to additional downstream devices, in some embodiments, the AFCI receptacle 100 includes different terminal connection components configured to receive power from the external power source and/or provide power to downstream devices. For example, FIGS. 5A-5B illustrate an embodiment of the AFCI receptacle 100 that includes line and load terminal connectors that are coupled to the AFCI receptacle 100 by a snap fit connection, such as the receptacles described in U.S. Patent Application Publication No. 2021/0226389, published Jul. 22, 2021 and entitled "GROUND FAULT CIRCUIT INTERRUPTERS AND CONNECTORS FOR USE WITH THE SAME," the entire content of which is hereby incorporated by reference. It should be understood that, in some embodiments, the AFCI receptacle 100 is implemented as a receptacle type that is not explicitly described herein.

Figure 6:
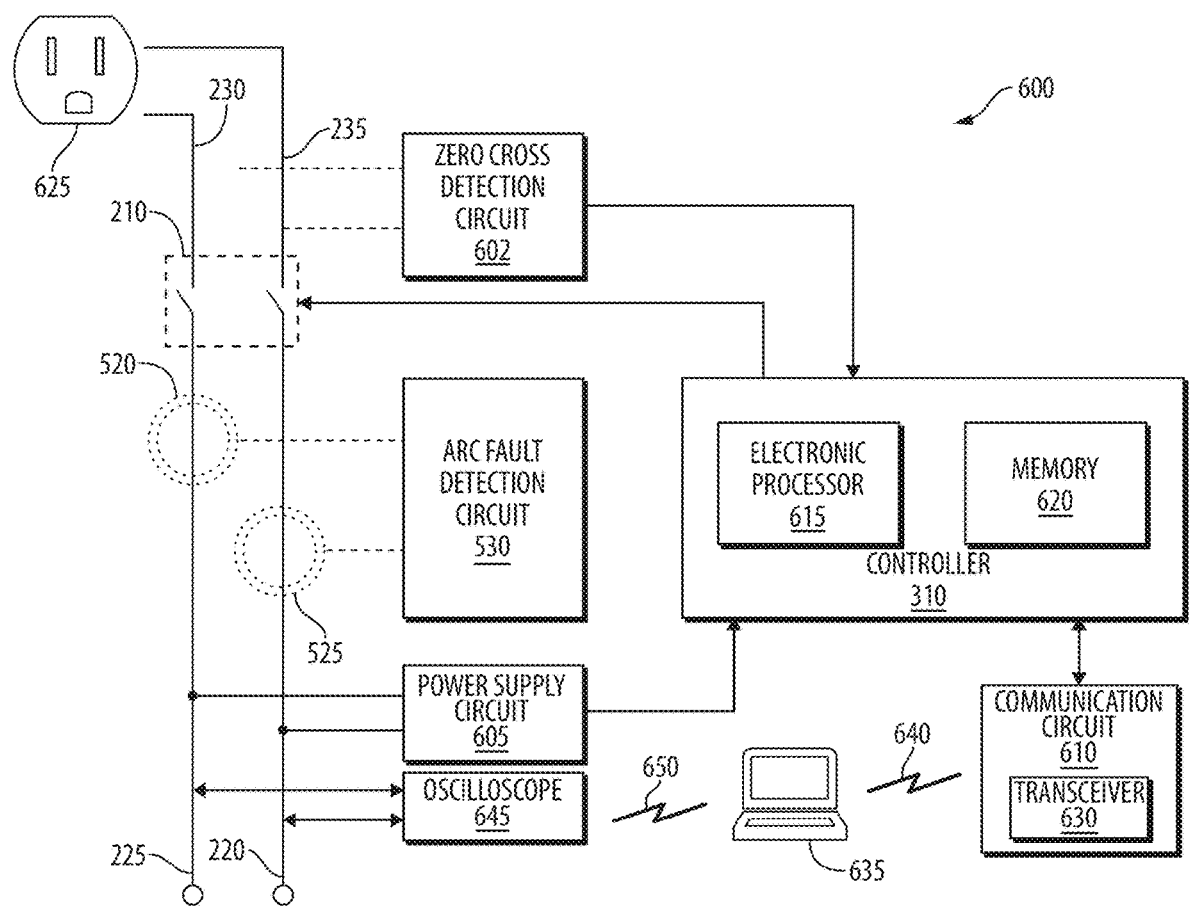
FIG. 6 illustrates a block diagram of a control system of the AFCI receptacle of FIG. 1A, according to some embodiments of the application.

FIG. 6 is a block diagram illustrating a control system, or circuit, 600 of the AFCI receptacle 100. In the illustrated embodiment, the control system 600 includes the controller 310 supported by primary board 200. However, it should be understood that, in some embodiments, the control system 600 is implemented with a controller supported by the secondary board 400. That is, in embodiments in which the secondary board 400 includes its own controller, the controller supported by the secondary board 400 may be configured to perform the processes described herein with respect to the controller 310. Similarly, the control system 600 of the illustrated embodiment includes first and second coils 520, 525 and the arc fault detection circuit 530, which are supported by secondary board 400. However, it should be understood that in embodiments in which the AFCI receptacle 100 does not include a secondary board 400, the first and second coils 520, 525 and arc fault detection circuit 530 are supported by the primary board 200.

As shown in FIG. 6, the controller 310 is electrically and/or communicatively connected to a variety of modules or components of the AFCI receptacle 100. For example, the controller 310 is connected to the interrupting device 210, the first and second coils 520, 525, the arc fault detection circuit 530, a zero cross detection circuit 602, a power supply circuit 605, and a communication circuit 610.

In some embodiments, the controller 310 includes a plurality of electrical and electronic components that provide power, operational control, and protection to the components and modules within the controller 310 and/or the AFCI receptacle 100. For example, the controller 310 includes, among other things, an electronic processor 615 (for example, a microprocessor or another suitable programmable device) and a memory 620. In some embodiments, the controller 310 further includes the arc fault detection circuit 530 and the zero cross detection circuit 602. That is, in some embodiments, the arc fault detection circuit 530 is integrated within the controller 310.

The memory 620 includes, for example, a program storage area and a data storage area. The program storage area and the data storage area can include combinations of different types of memory, such as read-only memory (ROM) and/or random-access memory (RAM). Various non-transitory computer readable media, for example, magnetic, optical, physical, or electronic memory may be used. The electronic processor 615 is communicatively coupled to the memory 620 and executes software instructions that are stored in the memory 620, or stored on another non-transitory computer readable medium such as another memory or a disc. Instructions may include instructions, which when executed by processor 615, cause the control system 600 to implement any of a variety of arc fault detection actions as described herein. The software may include one or more applications, program data, filters, rules, one or more program modules, and other executable instructions.

In some embodiments, the memory 620 stores a machine learning model that is to be implemented by the electronic processor 615. In some embodiments, the machine learning model is executed by the electronic processor 615 to cause the control system 600 to detect an arc fault within AFCI receptacle 100 and/or the circuit to which the AFCI receptacle 100 is connected. More particularly, the machine learning model may be executed by electronic processor 615 to cause the controller 310 and/or arc detection circuit 530 to detect an arc fault within AFCI receptacle 100 and/or the circuit to which the AFCI receptacle 100 is connected. The machine learning model may be implemented as, for example, a neural network, a fuzzy logic model, convolutional network, or other such model trained to detect arc faults as detailed herein.

The phase and neutral line contact arms, or terminals, 220, 225 are configured to receive a line power from source. The first and second coils 520, 525 are arranged to monitor current flowing through the phase and neutral line terminals 220, 225 respectively. As described above, the phase and neutral line terminals support contacts 240, 245 are selectively connected, via interrupting device 210, to the load contacts 250, 255 supported by phase and neutral load terminals 230, 235. The phase and neutral load terminals 230, 235 are configured to power an external load connected to an outlet 625 of AFCI receptacle 100. The zero cross detection circuit 602 is configured to measure the line voltage and frequency of the line terminals 220, 225 and/or the load terminals 230, 235.

In some embodiments, the first and second coils 520, 525 are arranged to monitor current flowing through the phase and neutral load terminals 230, 235. In some embodiments, the first and second coils 520, 525 are arranged to monitor current flowing through the phase and neutral line terminals respectively, and third and fourth coils (not shown) are arranged to monitor current flowing through the phase and neutral load terminals 230, 235, respectively. Current measurements taken by the first and second coils 520, 525 are provided to the arc fault detection circuit 530 and/or controller 310. In some embodiments, the arc fault detection circuit 530 further includes the zero cross detection circuit 602. That is, in some embodiments, the zero cross detection circuit 602 is integrated within the arc fault detection circuit 530.

The power supply circuit 605 is configured to convert line power to a nominal power for use by the controller 310. For example, the power supply circuit 605 may include a rectifier that is configured to rectify the line power to a nominal power for powering the controller 310. In some embodiments, the power supply circuit 605 rectifies alternating current (AC) power to a nominal direct current (DC) power. In some embodiments, the power supply circuit 605 includes one or more additional conversion circuits for converting line power to one or more additional power levels for use by control system 600.

The communication circuit 610 is configured to provide communication between the AFCI receptacle 100 and one or more external devices (for example, other receptacles, electrical devices, external computers, smart phones, tablets, etc.). For example, the communication circuit 610 is configured to provide communication between the AFCI receptacle 100 and an external device 635. In the illustrated embodiment, the external device 635 is shown as a laptop that includes an electronic processor and a memory. However, it should be understood that the external device 635 may be implemented as one or more of the above noted examples.

In such embodiments, the AFCI receptacle 100 communicates with the one or more external devices through a network using, for example, the transceiver 630. The network is, for example, a wide area network (WAN) (e.g., the Internet, a TCP/IP based network, a cellular network, such as, for example, a Global System for Mobile Communications [GSM] network, a General Packet Radio Service [GPRS] network, a Code Division Multiple Access [CDMA] network, an Evolution-Data Optimized [EV-DO] network, an Enhanced Data Rates for GSM Evolution [EDGE] network, a 3GSM network, a 4GSM network, a Digital Enhanced Cordless Telecommunications [DECT] network, a Digital AMPS [IS-136/TDMA] network, or an Integrated Digital Enhanced Network [iDEN] network, etc.). In other embodiments, the network is, for example, a local area network (LAN), a neighborhood area network (NAN), a home area network (HAN), or personal area network (PAN) employing any of a variety of communications protocols, such as Wi-Fi, Bluetooth, ZigBee, etc. In yet another embodiment, the network includes one or more of a wide area network (WAN), a local area network (LAN), a neighborhood area network (NAN), a home area network (HAN), or personal area network (PAN). In some embodiments, the communication circuit 610 communicates with the external device 635 using a wired connection.

In some embodiments, the transceiver 630 is configured to enable wireless communication between the AFCI receptacle 100 and an external device 635 using a wireless communication link 640. In other embodiments, rather than a transceiver 630, the AFCI receptacle 100 includes separate transmitting and receiving components, for example, a transmitter and a receiver. In operation, the controller 310 is configured to control the communication circuit 610 to transmit and receive data to and from the AFCI receptacle 100.

In some embodiments, the control system 600 further includes an oscilloscope 645. The oscilloscope 645 is configured to measure current, voltage, frequency, and/or other electrical characteristics of the AFCI receptacle 100. In the illustrated embodiment, oscilloscope 645 is shown as measuring the line-side current and voltage; however, it should be understood that the oscilloscope 645 may also be configured to measure load-side characteristics of the AFCI receptacle 100. As shown, the oscilloscope 645 is configured to provide the current and voltage measurements to external device 635 via a communication link 650, which may be implemented as a wireless or wired connection.

During operation of the AFCI receptacle 100, the control system 600 may be in a standby mode or an operation mode. When in the standby mode, the interrupting device 210 electrically disconnects the line terminals 220, 225 from the load terminals 230, 235. Accordingly, in the standby mode, power is not provided to the outlet 625. When in the operation mode, the interrupting device 210 electrically connects the line terminals 220, 225 to the load terminals 230, 235. Accordingly, in the operation mode, power is provided to the outlet 625 and, thus, to an external load electrically connected to the outlet 625.

While power is provided to the outlet 625, the control system 600 is configured to monitor for the occurrence of an arc fault within the AFCI receptacle 100 and/or the circuit to which AFCI receptacle 100 is connected. In particular, the arc fault detection circuit 530 and/or the controller 310 are configured to perform one or more arc fault detection processing techniques to determine whether an arc fault is present. For example, when determining whether an arc fault is present, the arc fault detection circuit 530 and/or controller 310 may be configured to extract and analyze measurements indicative of volatility, power, and frequency content of an external load from the load terminals 230, 235. Furthermore, as another example, the arc fault detection circuit 530 and/or controller 310 are configured to employ statistical and spectral analysis to analyze line and/or load current measurements recorded by the first and second coils 520, 525. The arc fault detection circuit 530 and/or controller 310 analyzes the line and load terminal currents, voltages, and/or frequencies in the digital domain to reduce noise. As described below, the controller 310 may be further configured to determine whether an arcing fault is present by applying the analysis of the line and/or load electrical characteristics to a deep learning/machine learning model.

Figure 7:
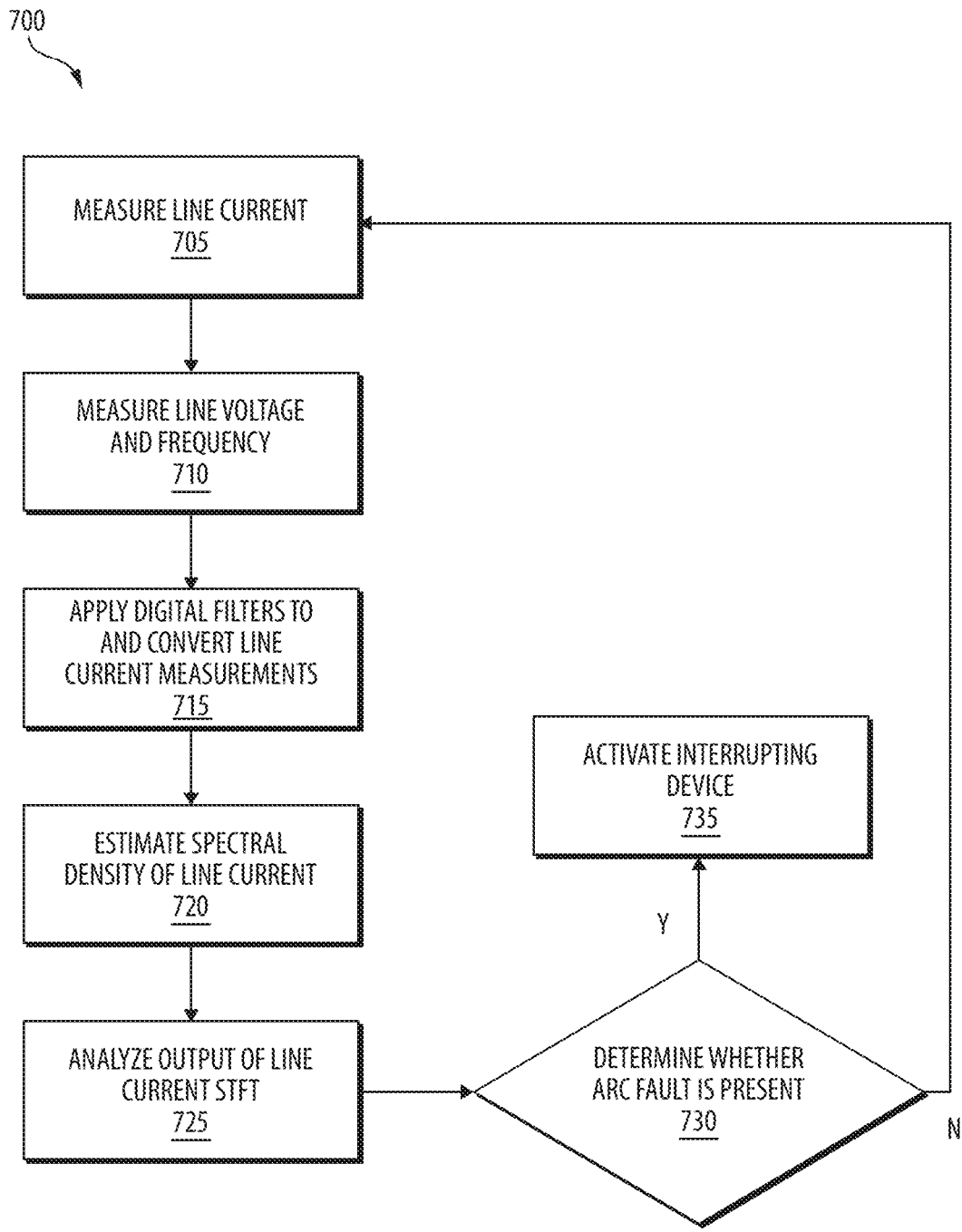
FIG. 7 is a flowchart illustrating a process, or operation, for detecting an arc fault, according to some embodiments.

FIG. 7 illustrates a process, or operation, 700 for detecting the presence of an arc fault within the AFCI receptacle 100 and/or the circuit to which the AFCI receptacle 100 is connected, according to some embodiments. Although operation 700 is described as being performed in part by controller 310, operation 700 may also be performed by the controller included in arc fault detection circuit 530 and/or a combination of the controller 310, the controller included arc fault detection circuit 530, and one or more other components included in control system 600. It should be understood that the order of the steps disclosed in operation 700 could vary. For example, although illustrated as occurring in serial order, in other embodiments, the steps disclosed may be performed in parallel order. Furthermore, in some embodiments, additional steps may be added to the process.

At block 705, a wideband current sensor, such as the first and second coils 520, 525, measures the current flowing through line terminals 220, 225 (block 705). As described above, in some embodiments, the first and second coils 520, 525 measure the current flowing through load terminals 230, 235 instead. In some embodiments, the first and second coils 520, 525 measure the current flowing through line terminals 220, 225 and third and further coils measure the current flowing through load terminals 230, 235. Current measurements are provided to the arc fault detection circuit 530 and/or controller 310 for digitization and further processing and analysis.

At block 710, the zero cross detection circuit 602 measures the voltage and frequency of line terminals 220, 225. In some embodiments, the zero cross detection circuit 602 measures the voltage and frequency of the load terminals 230, 235 instead. In some embodiments, the zero cross detection circuit 602 measures the voltage and frequency of the both the line terminals 220, 225 and the load terminals 230, 235. As described above, the zero cross detection circuit 602 may be implemented as a separate circuit, integrated within arc fault detection circuit 530, or integrated within controller 310. Voltage and frequency measurements are provided to the arc fault detection circuit 530 and/or controller 310 for further processing and analysis.

At block 715, digital filters are applied to the line current measurements taken by the first and second coils 520, 525. That is, the line current measurements are digitized and filtered. In some embodiments, the arc fault detection circuit 530 applies digital filters to the line current measurement signals, while in other embodiments, the controller 310 applies the digital filters to the line current measurement signals. In some embodiments, the controller 310 is further configured to implement multi-rate analysis (e.g., down-sampling/decimation and up-sampling/interpolation) to optimize the digital filters applied to the line current measurement signals. For example, the controller 310 may be configured to phase lock the analog-to-digital conversion (ADC) sampling rate to the line frequency measured by zero cross detection circuit 602, such that the current sample(s) used to calculate the spectral density of the current are synchronized to the line voltage. In some embodiments, the arc fault detection circuit 530 includes logic components, such as a separate controller, that are capable of phase locking the ADC sampling rate.

At block 720, the controller 310 is configured to estimate, or calculate, the spectral density of the line current measurement signals (block 720). In some embodiments, the controller 310 is configured to use Welch's Method for calculating the spectral density of line current. In other embodiments, the controller 310 is configured to use a Short Time Fourier Transform (STFT) for calculating the spectral density of the line current. In some embodiments, the controller included in arc fault detection circuit 530 calculates the spectral density of the line current.

Figure 8:
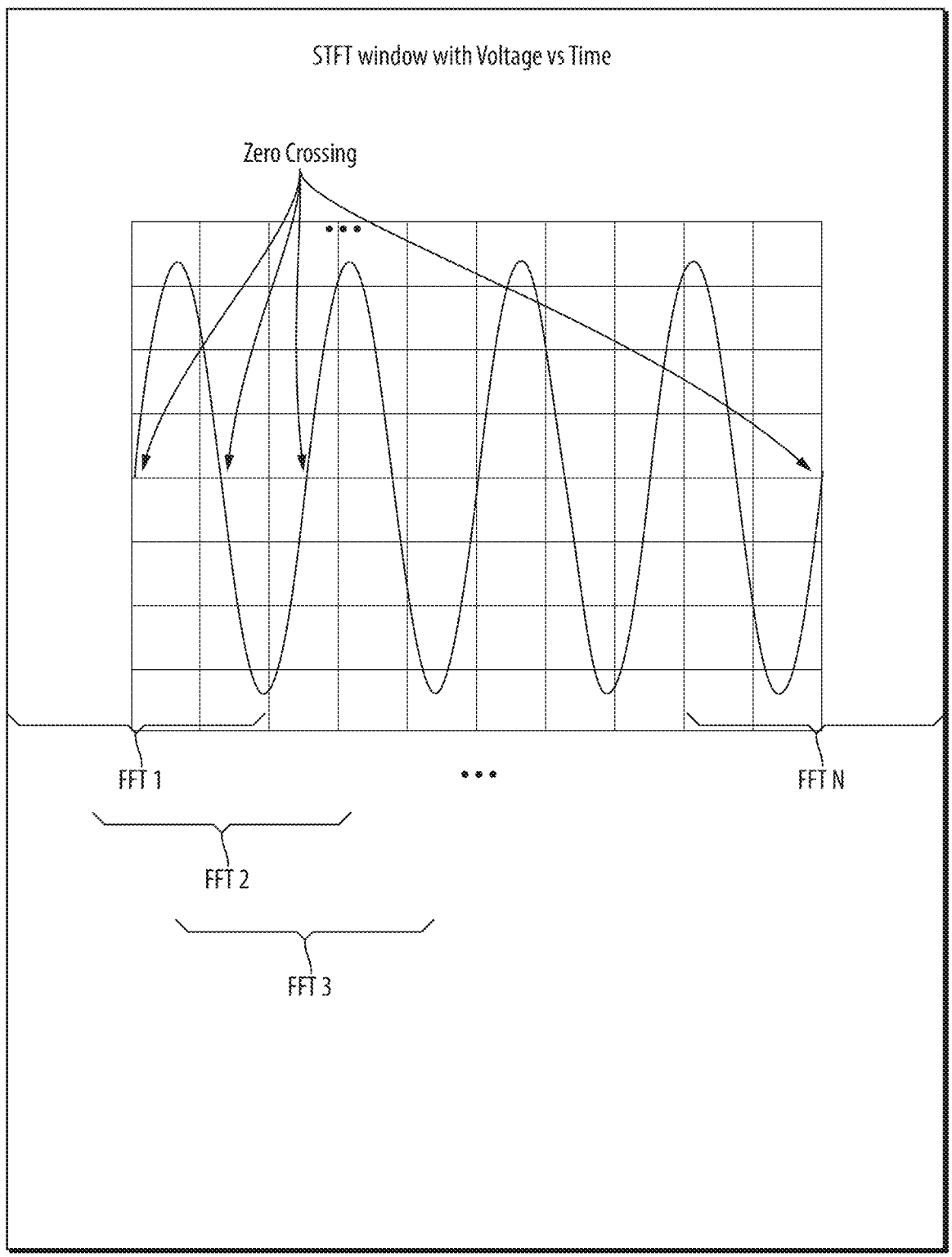
FIG. 8 illustrates synchronized Short Time Fourier Transform windows, according to some embodiments.

As described above, the controller 310 synchronizes the ADC sampling rate of the line current with the measured line voltage while calculating the spectral density of the line current. Thus, in embodiments in which the controller 310 calculates the spectral density of line current using STFT, the line voltage zero crossing is centered in the Fourier Transform window. For example, FIG. 8 illustrates an STFT window with voltage vs. time. As shown, Fast Fourier Transform (FFT) windows that are used to calculate the STFT are centered around the zero crossing of the line voltage. An FFT is calculated every ½ alternating current (AC) cycle (e.g., approximately every 8.33 ms in a 60 Hz system), and a particular FFT window consists of one or more AC cycles that overlap with a previous FFT window. Since the FFT assumes a periodic signal, by synchronizing and aligning the voltage zero cross with the center of an FFT window, symmetry is preserved and spectral leakage is minimized.

Figure 9:
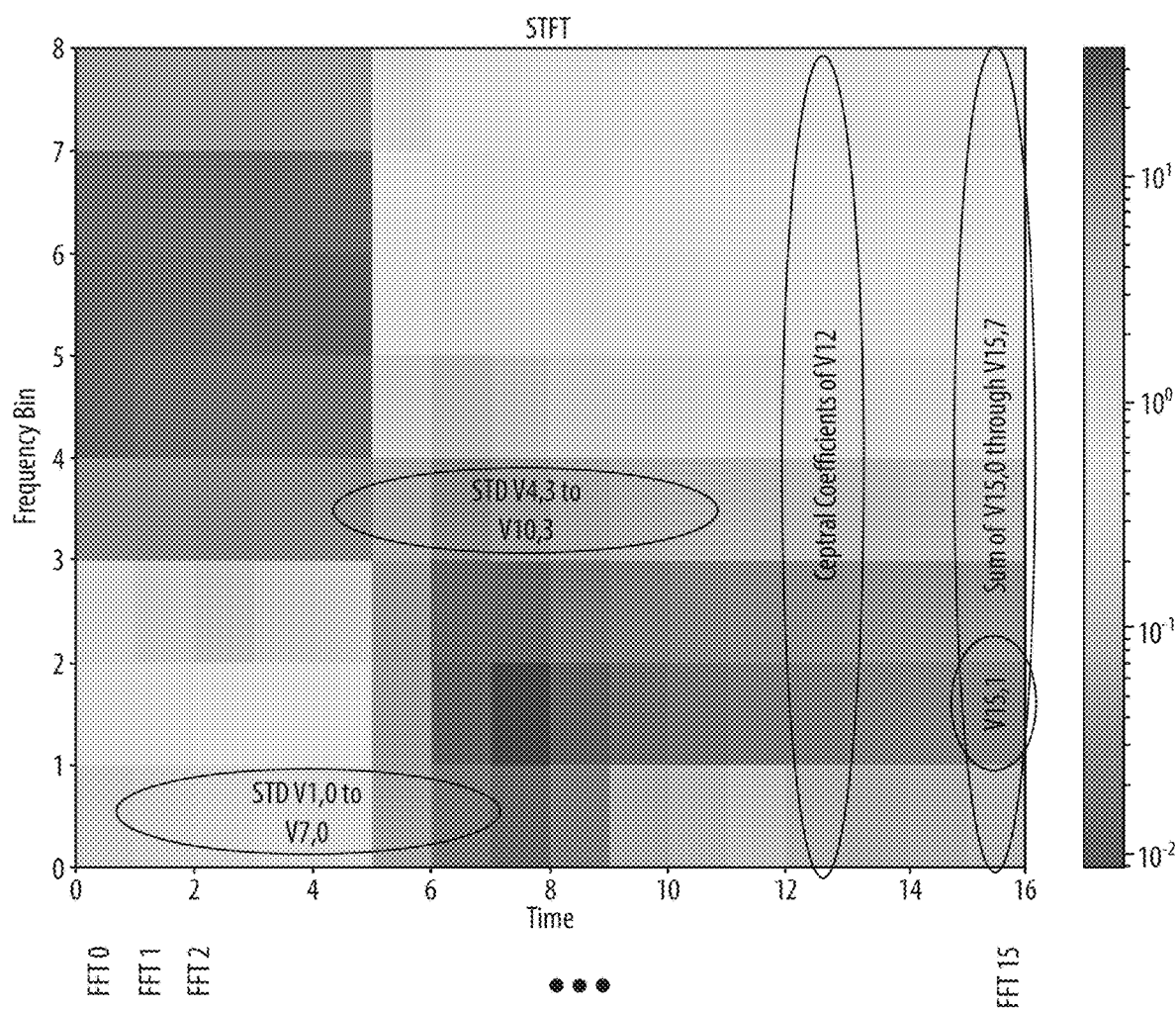
FIG. 9 illustrates an exemplary spectral density of line current measurements, according to some embodiments.

In some embodiments, when estimating the line current spectral density using STFT or Welch's Method, the controller 310 periodically calculates 'n' frequency bin values. That is, the controller 310 may be configured to calculate 'n' frequency bin values every time interval 'm.' FIG. 9 illustrates an example of how spectral density of the line current is estimated using STFTs. As shown, a value $V_{m,n}$ is calculated for time 'm' and frequency bin 'n' at each Time value, or point along the time axis. For example, at Time 0, values $V_{0,0}$ $V_{0,1}$ $V_{0,2}$ . . . . $V_{0,n}$ are calculated. Similarly, at Time 1, values $V_{1,0}$ $V_{1,1}$ $V_{1,2}$ . . . . $V_{1,n}$ are calculated and, at Time m, values $V_{m,0}$ $V_{m,1}$ $V_{m,2}$ . . . . $V_{m,n}$ are calculated.

At block 725, the controller 310 is configured to analyze the spectral density of line current using statistical (e.g., standard deviations) and spectral (e.g., spectral coefficients) analysis. Analysis of the spectral density of line current may include estimating, or calculating, of one or more arcing characteristics, or features, of the line current spectral density.

In some embodiments, the controller 310 is configured to estimate volatility of the line current, and thus load power volatility, by calculating the standard deviation of the line current spectral density magnitude. With reference to FIG. 9, the controller 310 may be configured to calculate the standard deviation of a group of values $V_{m,n}$ to determine the volatility of the magnitude for a specific frequency bin. For example, this feature may be calculated by taking the standard deviation of $V_{m-x,0}$ to $V_{m,0}$, where 'x' is the size of the sampling history (e.g., typically between 4 and 32). This standard deviation process may be repeated for frequency bins 1 through 'n' (e.g., taking the standard deviation of $V_{m-x,n}$ to $V_{m,n}$). Accordingly, controller 310 may be configured to quantify load power volatility by estimating the standard deviation of line current spectral density magnitude.

In some embodiments, the controller 310 is configured to calculate the ratio, or percentage of total, of the magnitude at a particular frequency bin 'n' to the weighted sum of the entire frequency bin magnitude. In other words, the controller 310 may be configured to determine a percentage 'x %,' or ratio of the frequency bin magnitude that is attributed to a particular frequency bin value. For example, with reference to FIG. 9, the controller 310 may be configured to calculate the ratio of $V_{15,1}$ by dividing $V_{15,1}$ by the sum of $V_{15,0}$ through $V_{15,7}$.

In some embodiments, the controller 310 is configured to implement a different method to quantify volatility by using Cepstral Coefficients. In such embodiments, the Cepstral Coefficients may be calculated by taking a discrete cosine transform of the line current STFT either directly or with a Mel-Frequency Scale (MFCC) conversion. Combining or converting the line current spectrum to the Mel-Frequency Scale or some other scale reduces the amount of data that needs to be processed by controller 310.

At block 730, these arcing characteristics (e.g., volatility, standard deviations, frequency bin magnitude ratios, and Cepstral coefficients) are used by the controller 310 to predict the presence of an arc fault. In some embodiments, the controller 310 is configured to compare one or more of these arcing features to one or more thresholds. For example, the controller 310 may be configured to compare one or more of the calculated Cepstral Coefficients, spectral density magnitudes indicative of load power volatility, standard deviations of the line current spectral density, and/or frequency bin magnitude ratios to one or more respective thresholds. Based on the comparison of the arcing characteristics to the one or more thresholds, the controller 310 is configured to determine whether an arc fault is present (block 730). In some embodiments, the controller 310 is configured to determine that an arc fault is present when at least one of the Cepstral Coefficients, spectral density magnitude volatility, standard deviations of the line current spectral density, and/or frequency bin magnitude ratios exceeds a respective threshold. In some embodiments, the controller 310 determines that an arc fault is present when two or more of the Cepstral Coefficients, spectral density magnitude volatility, standard deviations of the line current spectral density, and/or frequency bin magnitude ratios exceeds a respective threshold. In some embodiments, the controller included in arc fault detection circuit 530 is configured to compare the arcing characteristics to one or more thresholds. When the controller 310 and/or arc fault detection circuit 530 determine that an arc fault is present (e.g., predicts that the probability of an arc fault being present exceeds one or more thresholds), the controller 310 activates interrupting device 210 to separate the line terminals 220, 225 from the load terminals 230, 235 (block 735).

In some embodiments, determining whether an arc fault is present includes predicting the probability of the presence of an arc fault based on the calculated arcing characteristics. For example, in some embodiments, the controller 310 configured to estimate the probability of an arc fault occurring based on comparisons of the arcing characteristics to the one or more thresholds. In such embodiments, the controller 310 is configured to determine that an arc fault is occurring when the determine probability of an arc fault occurring exceeds a threshold (e.g., 90%).

Figure 10:
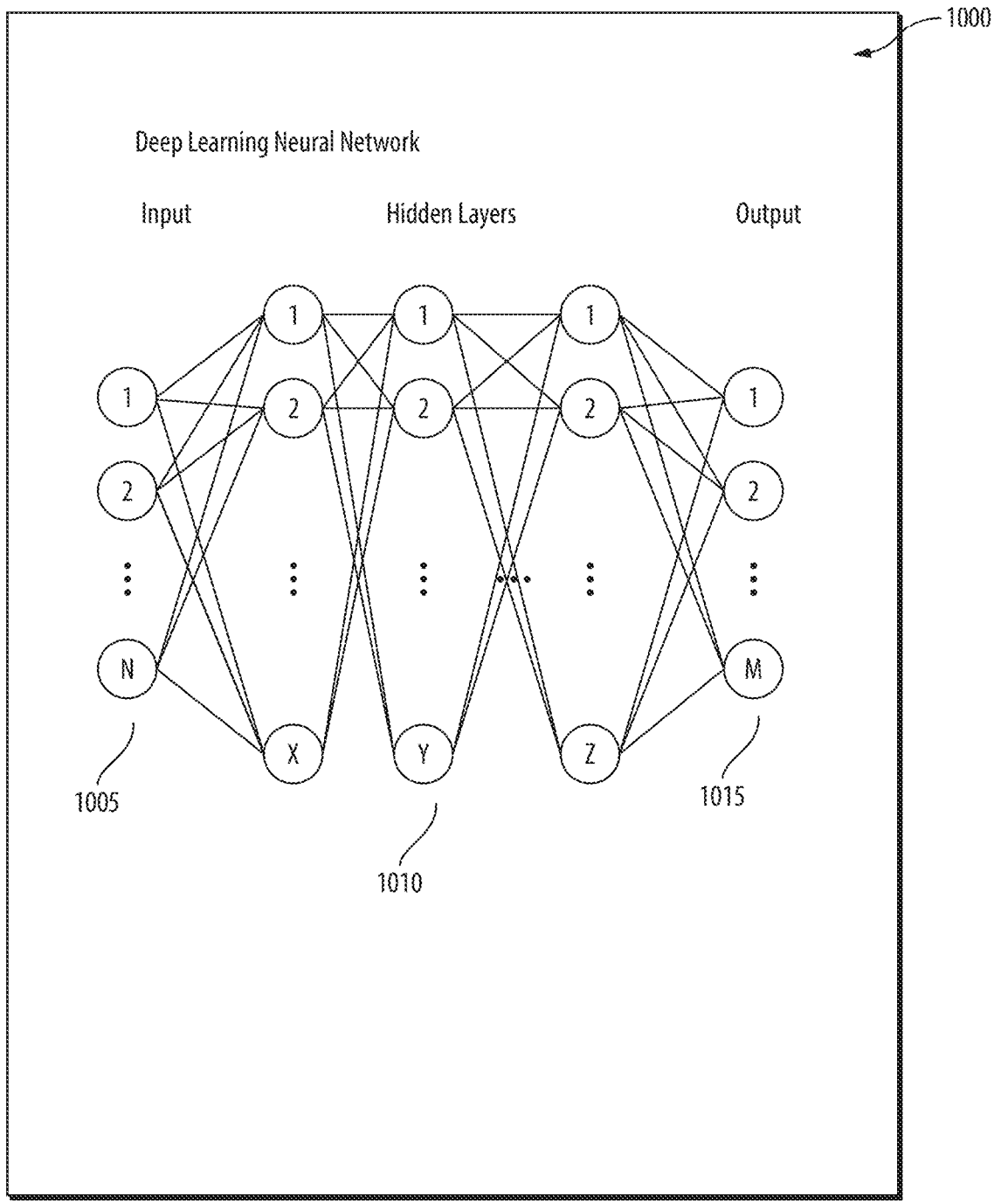
FIG. 10 illustrates a schematic of a machine learning model, according to some embodiments of the application.

In some embodiments, the controller 310 is configured to execute a machine learning model when predicting the presence of an arc fault based on determined arcing characteristics of the line current. For example, FIG. 10 illustrates a generic structure of a machine learning model 1000. The machine learning model 1000 is depicted as a neural network; however, the machine learning model may be implemented as any one or more of a deep learning algorithm, a neural network, a support-vector machine, and a long short-term memory.

As shown, N arcing features, or characteristics, of the line current spectral density, such as MFCC, frequency bin magnitudes, volatility/standard deviation of frequency bin magnitudes, and ratios of frequency bin magnitude to total sum, may be provided as inputs 1005 to the machine learning model 1000. The machine learning model 1000 further includes multiple hidden layers 1010, each hidden layer 1010 including an independent number of neurons. For example, the machine learning model 1000 may include 2-4 hidden layers 1010 with 2-256 nodes per layer. The hidden layers 1010 are configured to generate M outputs 1015 based on one or more weights, biases, and/or thresholds associated with the arcing characteristics provided as inputs 1005. As will be described in more detail later on, the weights, biases, and/or thresholds that are used to calculate the outputs 1015 are generated using a supervised training algorithm that executed by an external device, such as the external device 635. The outputs 1015 represent the probability of a binary, or multi-class classification, of the load current that includes arc fault, normal operation, and/or other classifications of the load. That is, the outputs 1015 indicate whether the load current is, or is likely to be, experiencing an arc fault condition or a normal operating condition. In some embodiments, the outputs 1015 include a probability of an arc fault being present within AFCI receptacle 100 and/or the circuit to which AFCI receptacle 100 is connected. In such embodiments, the controller 310 is configured to determine that an arc fault is present when the probability exceeds a probability threshold. In some embodiments, the probability threshold is a configurable value determined by a user. In other embodiments, the probability threshold is determined during creation of the machine learning model 1000.

In some embodiments, the controller 310 is configured to implement more than one arc fault detection method when determining whether an arc fault is present within the AFCI receptacle 100 and/or the circuit to which the AFCI receptacle 100 is connected, according to some embodiments. For example, the controller 310 may be configured to implement a machine learning, probability-based arc fault detection method, such as methods that are similar to the method described above with respect to operation 700. In some embodiments, the controller 310 is further configured to implement a correlation-based arc fault detection method, such as the arc fault detection methods described in U.S. Patent Application Publication No. 2020/0036183, published Jan. 30, 2020, and entitled "SYSTEM AND METHOD FOR DISCERNING ARCING IN ELECTRICAL WIRING," the entire content of which is hereby incorporated by reference. In some embodiments, the controller 310 is configured to implement the correlation-based arc fault detection methods described in U.S. Patent Application Publication No. 2020/0264234, published Aug. 20, 2020, and entitled "APPARATUSES AND METHODS FOR PASSIVE FAULT MONITORING OF CURRENT SENSING DEVICES IN PROTECTIVE CIRCUIT INTERRUPTERS," the entire content of which is hereby incorporated by reference.

Figure 11:
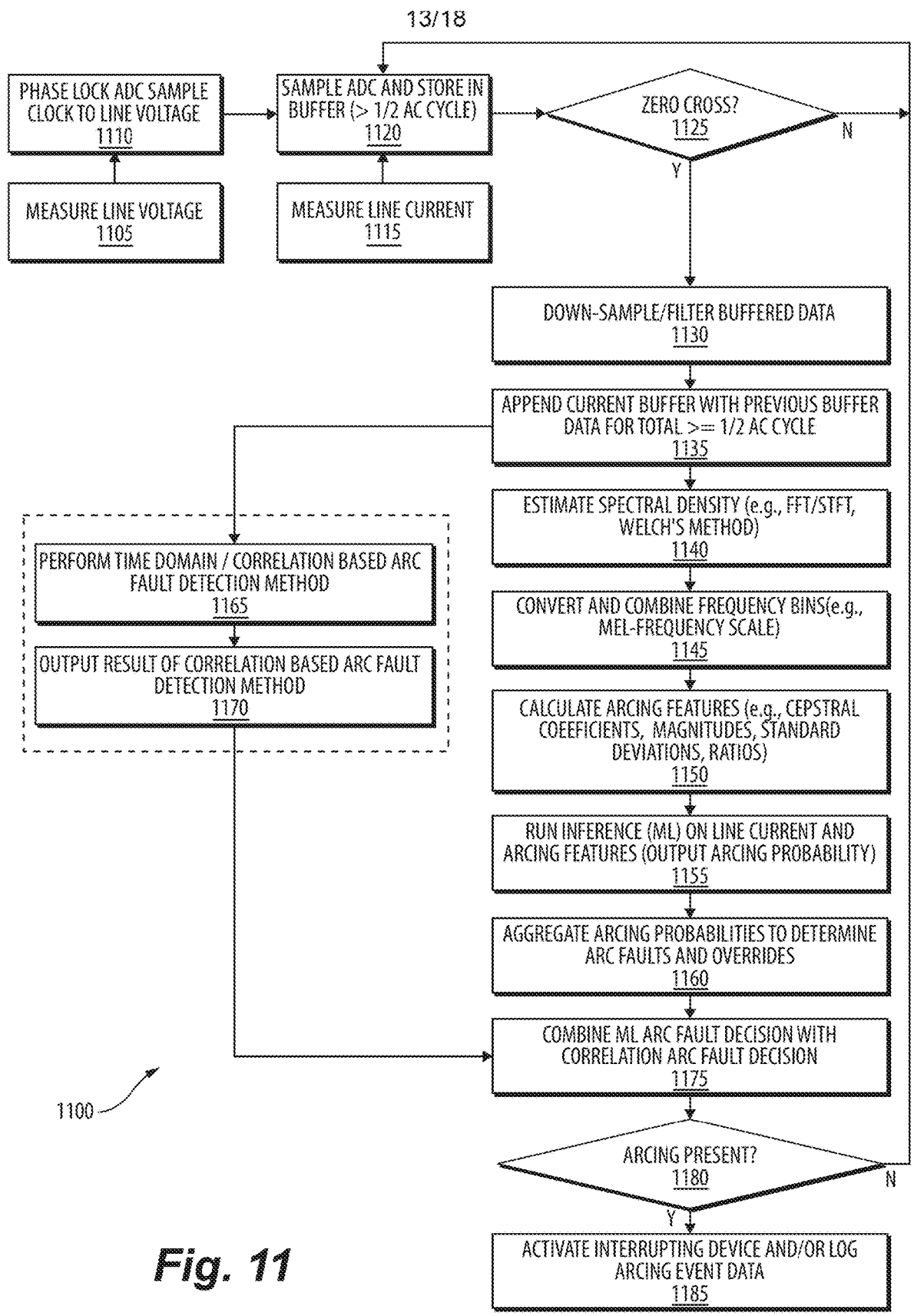
FIG. 11 is a flowchart illustrating a process, or operation, for detecting an arc fault, according to some embodiments

FIG. 11 illustrates a process, or operation, 1100 for detecting the presence of an arc fault within the AFCI receptacle 100 and/or the circuit to which the AFCI receptacle 100 is connected by using two or more different arc fault detection methods, according to some embodiments. Although operation 1100 is described as being performed in part by controller 310, operation 1100 may also be performed by the controller included in arc fault detection circuit 530 and/or a combination of the controller 310, the controller included arc fault detection circuit 530, and one or more other components included in control system 600. It should be understood that the order of the steps disclosed in operation 1100 could vary. For example, although illustrated as occurring in serial order, in other embodiments, the steps disclosed may be performed in parallel order. Furthermore, in some embodiments, additional steps may be added to the process.

At block 1105, the voltage and/or frequency of line terminals 220, 225 is measured. In some embodiments, the zero cross detection circuit 602 measures the line-side voltage and frequency. In some embodiments, the zero cross detection circuit 602 measures the load-side voltage and frequency instead. In some embodiments, the zero cross detection circuit 602 measures the line-side and the load-side voltages and frequencies. As described above, the zero cross detection circuit 602 may be implemented as a separate circuit, integrated within arc fault detection circuit 530, or integrated within controller 310.

At block 1110, an analog-digital converter (ADC) sample clock included in controller 310 is phase locked to the line voltage frequency. In some embodiments, the ADC sample clock is a component of the arc fault detection circuit 530. In some embodiments, the ADC sample clock is a separate component included in control system 600.

At block 1115, a wideband current sensor, such as the first and second coils 520, 525, measures the current flowing through line terminals 220, 225. As described above, in some embodiments, the first and second coils 520, 525 measure the current flowing through load terminals 230, 235 instead. In some embodiments, the first and second coils 520, 525 measure the current flowing through line terminals 220, 225 and third and further coils measure the current flowing through load terminals 230, 235.

At block 1120, two or more buffers included in memory 620 are used to store line and/or load current sample data until a zero-crossing edge is detected (½ AC cycle). Accordingly, the current measurements are fixed between the rising and falling edge of the zero-cross detector because of the phase locked ADC sample clock.

At block 1125, controller 310 determines whether a zero-crossing is detected. When a zero-crossing has not been detected, process 1100 returns to block 1120 at which the current sample data is buffered. However, if a zero-crossing is detected at block 1125, operation 1100 proceeds to block 1130.

At block 1130, controller 310 applies digital filters to the line buffered current data. That is, the line current measurements are digitized and filtered. In some embodiments, the arc fault detection circuit 530 applies digital filters to the line current measurement signals. In some embodiments, the controller 310 is further configured to implement multi-rate analysis (e.g., down-sampling/decimation and up-sampling/interpolation) to optimize the digital filters applied to the line current measurement signals.

At block 1135, current data from one ½ AC cycle is appended to current data from a previous ½ AC cycle. The appended current data is then provided as inputs to both the machine learning (ML), or inference, based arc fault detection method (blocks 1140-1160) and the correlation-based arc fault detection method (blocks 1165-1170).

At block 1140, the ML-based arc fault detection method begins with controller 310 estimating the spectral density of the line current. As described above with respect to the operation 700, the controller 310 may be configured to use Welch's Method or Short Time Fourier Transforms for calculating the spectral density of the line current. In some embodiments, the controller included arc fault detection circuit 530 calculates the spectral density of the line current.

At block 1145, the controller 310 is configured to convert and combine frequency bins of the line current spectral density using a Mel-Frequency conversion scale, or some other conversion scale. As described above with respect to operation 700, combining or converting the line current spectral density to the Mel-Frequency Scale or some other scale reduces the amount of data that needs to be processed by controller 310. In some embodiments, the controller included in arc fault detection circuit 530 is configured to estimate the spectral density of line current.

At block 1150, the controller 310 calculates one or more arcing features, or characteristics, associated with spectral density of line current. As described above with respect to operation 700, these arcing characteristics include, but are not limited to, Cepstral Coefficients, spectral density magnitudes indicative of load power volatility, standard deviations of the line current spectral density, and frequency bin magnitude ratios. These arcing features may be calculated using the same or similar methods as described above with respect to operation 700.

At block 1155, the controller 310 is configured to run inference on the one or more arcing characteristics of the line current spectral density and output an arcing probability. That is, the controller 310 executes the machine learning model, such as the machine learning model 1000 described above with respect to FIG. 10. The one or more arcing features are provided as inputs 1005 to the machine learning model 1000, which produces outputs 1015. In some embodiments, the outputs 1015 include one or more probabilities that are indicative of whether arcing is occurring within AFCI receptacle 100 and/or the circuit to which AFCI receptacle 100 is connected. In some embodiments, the outputs 1015 include a single probability value indicative of the probability whether arcing is occurring. In some embodiments, the outputs 1015 includes more than one probability value indicative of whether arcing is occurring. In some embodiments, the controller included in arc fault detection circuit 530 runs inference on the one or more arcing characteristics of the line current spectral density.

At block 1160, the controller 310 is configured to aggregate the arcing probability value(s) calculated by inference. More particularly, controller 310 is configured to set one or more arc fault flags and override flags based the probability outputs 1015 of machine learning model 1000. The arc fault and override flags, which will be describe in more detail below, include the arc fault flag, the arc fault override flag, and the no arc override flag. In some embodiments, the flags are temporarily stored in memory 620. In some embodiments, the flags are stored in a log that is stored in memory 620. In some embodiments, the controller included in arc fault detection circuit 530 sets the flags.

In some embodiments, the controller 310 is configured to set the arc fault flag when the controller 310 determines that the probability of an arc fault occurring exceeds a first percentage threshold for at least a first amount of time during a time window. For example, the controller 310 may be configured to set the arc fault flag when the probability of an arc fault occurring exceeds 70% for at least half of a 1 s time window. In some embodiments, the controller 310 is further configured to set the arc fault override flag when the probability of an arc fault occurring exceeds a second threshold for at least a second amount of time during the time window. For example, the controller 310 may be configured to set the arc fault override flag when the probability of an arc fault occurring exceeds 80% for at least 0.9 s of a 1 s time window. In some embodiments, the first and second thresholds have the same value. In other embodiments, the first and second thresholds have different values. In some embodiments, the controller 310 is further configured to set the no arc override flag when the probability of an arc fault occurring is less than a third threshold for at least a third amount of time during the time window. For example, the controller 310 may be configured to set the arc fault flag when the probability of an arc fault occurring is less than 30% for at least 0.5 s of a 1 s time window.

Figure 12:
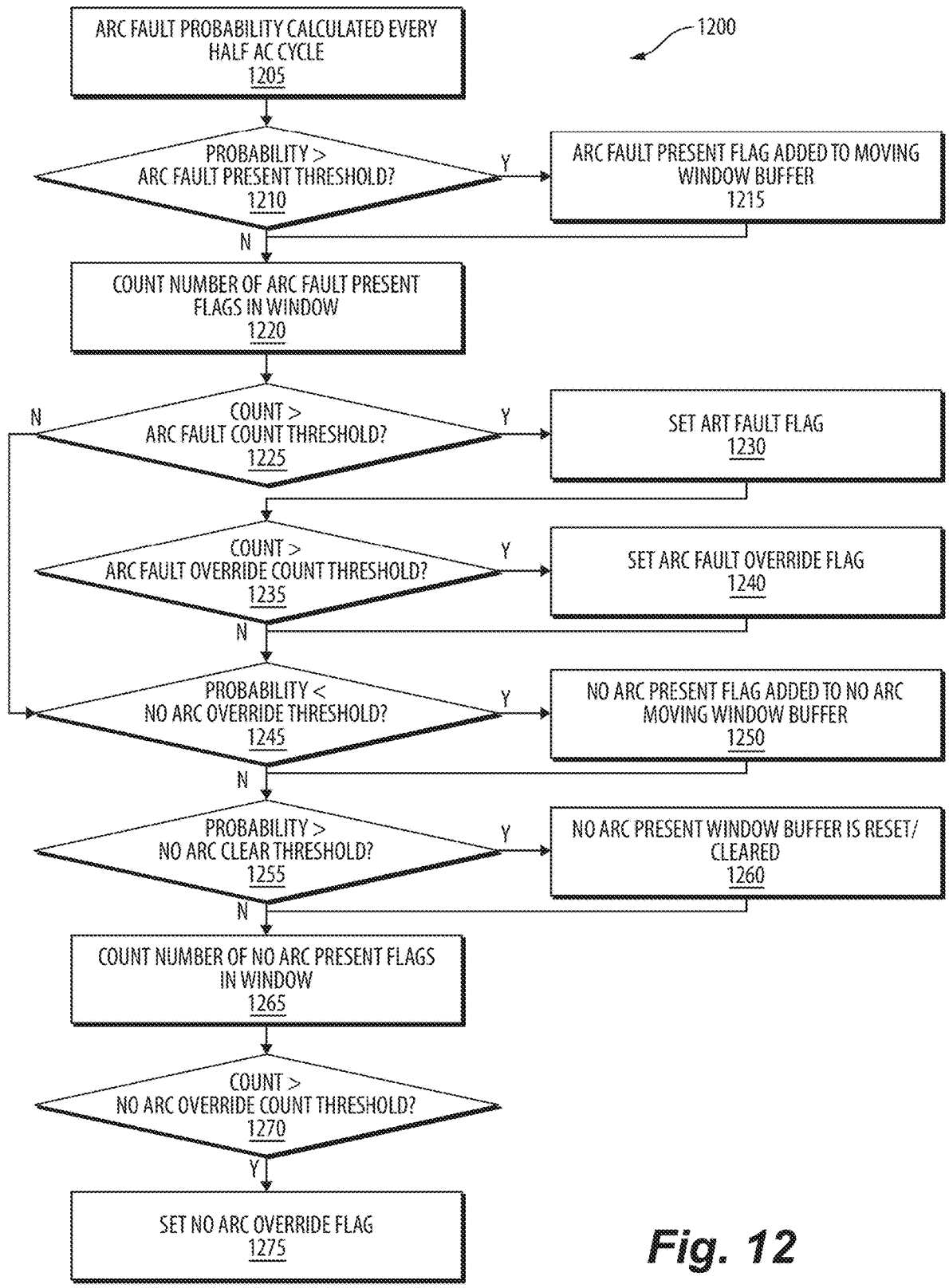
FIG. 12 is a flowchart illustrating a process, or operation, for aggregating outputs of an arc fault detection method, according to some embodiments.

FIG. 12 illustrates an exemplary process, or operation, 1200 for aggregating the arcing probability value(s) calculated at block 1155, according to some embodiments. Although operation 1200 is described as being performed in part by controller 310, operation 1200 may also be performed by the controller included in arc fault detection circuit 530 and/or a combination of the controller 310, the controller included arc fault detection circuit 530, and one or more other components included in control system 600. It should be understood that the order of the steps disclosed in operation 1200 could vary. For example, although illustrated as occurring in serial order, in other embodiments, the steps disclosed may be performed in parallel order. Furthermore, in some embodiments, additional steps may be added to the process.

At block 1205, an arc fault probability is calculated, using inference (e.g., the neural network), every ½ AC cycle. For example, in a 60 Hz system, an arc fault probability is calculated once every 8.3 ms.

At block 1210, controller 310 determines whether the arc fault probability is greater than an arc fault present threshold. As will be described in more detail below, in some embodiments, the arc fault present threshold is determined during the creation of a machine learning model, such as machine learning model 1000. In some embodiments, the arc fault present threshold is a configurable value determined by a user.

If the arc fault probability is greater than the arc fault present threshold, controller 310 is configured to add an arc fault present flag to a moving window buffer (block 1215). The moving window buffer is configured to contain, or hold, 'n' flags, where 'n' is a number greater than zero. That is, the moving window buffer holds 'n' flags associated with the previous, or most recent, 'n' calculated arcing probabilities and line current data samples. In some embodiments, the moving window buffer holds 32 flags. In such embodiments, the moving window buffer contains approximately 266.6 ms of line current data for a 60 Hz system (e.g., 32*8.3 ms). In some embodiments, the moving window buffer holds more than 32 flags. In other embodiments, the moving window buffer holds less than 32 flags. In some embodiments, the moving buffer window is stored in memory 620 of controller 310. In some embodiments, the moving buffer window is included in the machine learning model 1000 executed by controller 310. In some embodiments, the moving buffer window is a component of control system 600.

At block 1220, the controller 310 is configured to count the number of arc fault present flags that are held in the moving buffer window. At block 1225, the controller 310 determines whether the count of arc fault present flags held in the window exceeds an arc fault count threshold. In some embodiments, the arc fault count threshold is determined during the creation of machine learning model 1000, which will be described in more detail later. In some embodiments, the arc fault count threshold is a configurable value determined by a user.

If the controller 310 determines that the count is not greater than the arc fault count threshold, operation 1200 proceeds to block 1245. However, if the controller 310 determines that the count is greater than the arc fault count threshold, the controller 310 is configured to set the arc fault flag (block 1230). In some embodiments, the arc fault flag is a binary value stored within memory 620. In some embodiments, the arc fault flag is stored in a register of memory 620. In some embodiments, when the arc fault flag is set, the value of the arc fault flag is '1' or 'TRUE.' Likewise, when the count is not greater than the arc fault count threshold and the arc fault flag is not set, the value of the arc fault flag is '0' or 'FALSE.'

At block 1235, the controller 310 determines whether the count of arc fault present flags held in the moving buffer window exceeds an arc fault override count threshold. The value of the arc fault override count threshold is greater than the value of the arc fault count threshold. In some embodiments, the value of the arc fault override count threshold exceeds the value of the arc fault count threshold by a configurable amount. In some embodiments, the arc fault override count threshold is determined during the creation of machine learning model 1000, which will be described in more detail later. In some embodiments, the arc fault override count threshold is a configurable value determined by a user.

If the controller 310 determines that the count is not greater than the arc fault override count threshold, operation 1200 proceeds to block 1245. However, if the controller 310 determines that the count is greater than the arc fault override count threshold, the controller 310 is configured to set the arc fault override flag (block 1240). In some embodiments, the arc fault override flag is a binary value stored within memory 620. In some embodiments, the arc fault flag is stored in a register of memory 620. In some embodiments, when the arc fault override flag is set, the value of the arc fault override flag is '1' or 'TRUE.' Likewise, when the count is not greater than the arc fault override count threshold and the arc fault override flag is not set, the value of the arc fault override flag is '0' or 'FALSE.'

At block 1245, the controller 310 determines whether the arc fault probability is less than the no arc override threshold. As will be described in more detail below, in some embodiments, the no arc override threshold is determined during the creation of machine learning model 1000. In some embodiments, the no arc override threshold is a configurable value determined by a user.

If the arc fault probability is less than the no arc fault present threshold, controller 310 is configured to add a no arc fault present flag to a no arc moving window buffer (block 1250). In some embodiments, the no arc moving window buffer is the same as the moving window buffer. In other embodiments, the no arc moving window buffer is separate from the moving window buffer. In some embodiments, the no arc moving window buffer is configured to contain, or hold, 'n' flags, where 'n' is a number greater than zero. In some embodiments, the no arc moving window buffer holds 32 flags. In some embodiments, the moving window buffer holds more than 32 flags. In other embodiments, the no arc moving window buffer holds less than 32 flags. In some embodiments, the no arc moving buffer window is stored in memory 620 of controller 310. In some embodiments, the no arc moving buffer window is included in the machine learning model executed by controller 310. In some embodiments, the no arc moving buffer window is a component of control system 600.

At block 1255, the controller 310 determines whether the arc fault probability is greater than the no arc clear threshold. As will be described in more detail below, in some embodiments, the no arc clear threshold is determined during the creation of machine learning model 1000. In some embodiments, the no arc clear threshold is a configurable value determined by a user.

If the arc fault probability is greater than the no arc clear threshold, controller 310 is configured to clear, or reset, the no arc moving window buffer (block 1260). Accordingly, the controller 310 removes any no arc fault present flags from the no arc moving window buffer when the arc fault probability is greater than the no arc clear threshold.

At block 1265, controller 310 is configured to count the number of no arc fault present flags that are held in the no arc moving buffer window. At block 1270, the controller 310 determines whether the count of no arc fault present flags held in the window exceeds a no arc override count threshold. In some embodiments, the no arc override count threshold is determined during the creation of machine learning model 1000, which will be described in more detail later. In some embodiments, the no arc override count threshold is a configurable value determined by a user.

If the controller 310 determines that the no arc present flag count is greater than the no arc override count threshold, the controller 310 is configured to set the no arc override flag (block 1275). In some embodiments, the no arc override flag is a binary value stored within memory 620. In some embodiments, the no arc override flag is stored in a register of memory 620. In some embodiments, when the no arc override flag is set, the value of the no arc override flag is '1' or 'TRUE.' Likewise, when the no arc fault present flag count is less than or equal to the no arc override count threshold and the no arc override flag is not set, the value of the no arc override flag is '0' or 'FALSE.'

It should be understood that the no arc override flag and the arc fault flag are mutually exclusive. That is, the no arc override flag and the arc fault cannot both be set at the same time. For example, the clearing/reset of the no arc moving window buffer that occurs in block 1260 ensures that the no arc override flag is not set when the arc fault flag has been set.

Referring again to operation 1100, the filtered and appended line current buffer data (block 1135) is also provided as input to the second arc fault detection method included in operation 1100 (block 1165). As described above, the second arc fault detection is correlation-based arc fault detection method performed in the time domain. For example, the second arc fault detection method is implemented as one or more of the correlation-based arc fault detection methods described in U.S. Patent Application Publication No. 2020/0036183, published Jan. 30, 2020 and entitled "SYSTEM AND METHOD FOR DISCERNING ARCING IN ELECTRICAL WIRING," the entire content of which is hereby incorporated by reference and reproduced in part below. In some embodiments, the second arc fault detection method is implemented as one or more of the correlation-based arc fault detection methods described in U.S. Patent Application Publication No. 2020/0264234, published Aug. 20, 2020 and entitled "APPARATUSES AND METHODS FOR PASSIVE FAULT MONITORING OF CURRENT SENSING DEVICES IN PROTECTIVE CIRCUIT INTERRUPTERS," the entire content of which is hereby incorporated by reference and reproduced in part below.

At block 1165, the controller 310 executes, or performs, a correlation-based arc fault detection method using the current data provided from block 1135. In some embodiments, the controller included in arc fault detection circuit 530 performs the correlation-based arc fault detection method.

At block 1170, the controller 310 is configured to output the results of the correlation-based arc fault detection method. In some embodiments, the outputs include the status of a correlation arc fault flag and/or the status of a correlation arc override flag. Similar to the machine learning (ML) arc flags, or ML flags, described above, the correlation arc fault flag and the correlation arc override flag have values equal to '1' or 'TRUE' when they are set by controller 310. In some embodiments, the outputs include the cause of an arc fault, which can be detected based on load current magnitude.

At block 1175, the controller 310 is configured to combine the outputs of the ML-based arc fault detection method (block 1140-block 1160) with the outputs of the correlation-based arc fault detection method (block 1165-block 1170). In some embodiments, combining the outputs of the ML-based arc fault detection method with the outputs of the correlation-based arc fault detection method includes developing a relationship between the outputs of the two different arc fault detection methods. In such embodiments, the controller 310 may be configured to provide the outputs (e.g., values of the arc fault flags) of the two arc fault detection methods to one or more of a set of rules, weights, biases, thresholds, and/or a truth table that define the relationship between the ML-based arc fault detection method and the correlation-based arc fault detection method.

Figure 13:
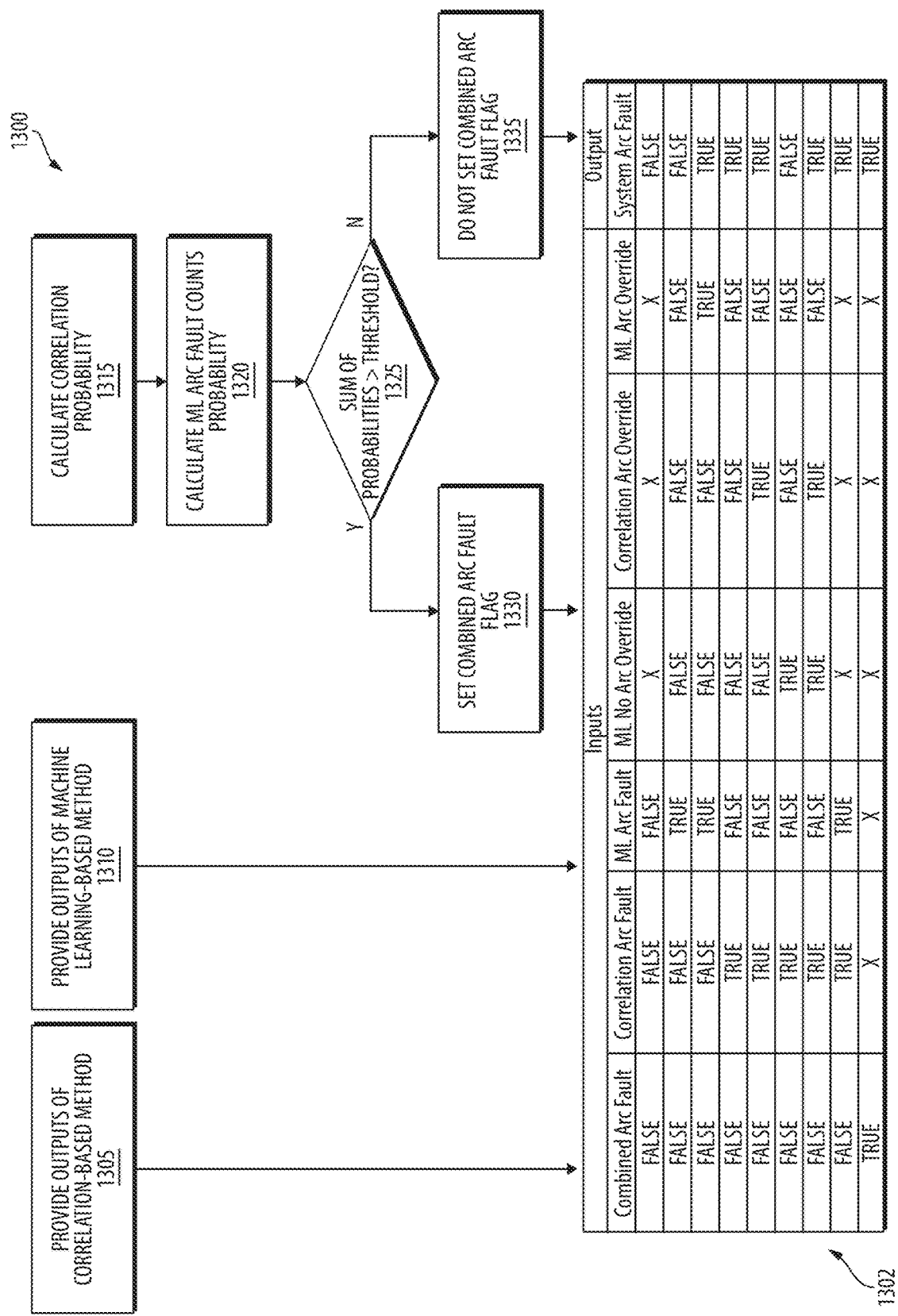
FIG. 13 is a flowchart illustrating a process, or operation, for combining outputs from more than one arc fault detection method, according to some embodiments.

FIG. 13 illustrates an exemplary process, or operation, 1300 for combing the outputs of the ML-based arc fault detection method with the outputs of the correlation-based arc fault detection method, according to some embodiments. Although operation 1300 is described as being performed in part by controller 310, operation 1300 may also be performed by the controller included in arc fault detection circuit 530 and/or a combination of the controller 310, the controller included arc fault detection circuit 530, and one or more other components included in control system 600. It should be understood that the order of the steps disclosed in operation 1300 could vary. For example, although illustrated as occurring in serial order, in other embodiments, the steps disclosed may be performed in parallel order. Furthermore, in some embodiments, additional steps may be added to the process.

At block 1305, controller 310 provides the outputs of the correlation-based arc fault detection method to the inputs of a decision tree, or truth table, 1302. In some embodiments, the outputs of the correlation-based arc fault detection method include values, or statuses (e.g., 'TRUE' or 'FALSE'), of the correlation arc fault flag and the correlation arc override flag. In some embodiments, additional outputs of the correlation-based arc fault detection method are provided to truth table 1302.

At block 1310, controller 310 provides the outputs of the ML-based arc fault detection method to the truth table 1302. In some embodiments, the outputs of the ML-based arc fault detection method include values, or statuses (e.g., 'TRUE' or 'FALSE'), the ML arc fault flag, the ML arc fault override flag, and the ML no arc override flag. The ML arc fault flag, the ML arc fault override flag, and the ML no arc override flag are respectively the same as the arc fault flag, the arc fault override flag, and the no arc override described above with respect to operation 1200. The identifier 'ML' is used to distinguish between the outputs of the correlation-based method and the ML-based arc fault detection method. In some embodiments, additional outputs of the ML-based arc fault detection method are provided to truth table 1302.

At block 1315, the controller 310 is configured to calculate the probability of an arc fault based on the window buffer counts from the correlation-based arc fault detection method. This probability may hereinafter be referred to as the correlation arc fault counts probability. In some embodiments, the controller 310 calculates this probability by dividing the number of counts by a correlation probability threshold. In some embodiments, the correlation probability threshold is determined during creation, or training of the machine learning model 1000. In some embodiments, the correlation probability threshold is a configurable value determined by a user.

At block 1320, the controller 310 is configured to calculate an ML arc fault counts probability based on a count of arc fault present flags held in the moving window buffer. In some embodiments, the controller 310 calculates this probability by dividing the number of counts by an ML counts probability threshold. In some embodiments, the ML counts probability threshold is determined during creation, or training, of the machine learning model 1000. In some embodiments, the machine learning counts probability threshold is a configurable value determined by a user.

At block 1325, the controller 310 is configured to determine whether the sum of the ML counts probability and the correlation arc fault counts probability is greater a combined arc fault probability threshold. In some embodiments, the combined arc fault threshold is determined during creation, or training, of the machine learning model 1000. In some embodiments, the combined arc fault probability threshold is a configurable value determined by a user. If the sum of probabilities exceeds the combined arc fault probability threshold, controller 310 sets the combined arc fault flag (e.g., the combined arc fault flag is 'TRUE') and provides the status of the combined arc fault flag to truth table 1302 (block 1330). If the sum of probabilities does not exceed the combined arc fault probability threshold, controller 310 does not set the combined arc fault flag (e.g., the combined arc fault flag is 'FALSE') and provides the status of the combined arc fault flag to truth table 1302 (block 1335).

Referring again to operation 1100, at block 1180, the controller 310 is configured to determine whether arcing, or an arc fault, is present within the AFCI receptacle 100 and/or the circuit to which the AFCI receptacle 100 is connected. In particular, controller 310 is configured to determine whether an arc fault is present based on one or more of the combined ML-based and correlation-based arc fault detection outputs.

In some embodiments, the controller 310 determines whether arcing is present based on the relationships, or set of rules, that define truth table 1302. As shown in FIG. 13, in such embodiments, the controller 310 is configured to determine that arcing is present (e.g., System Arc Fault is TRUE) when at least one of the following six conditions is met:

(1) the combined arc fault flag is TRUE and the remaining flags are FALSE,
(2) the correlation arc fault flag and the ML arc fault flag are both TRUE and the remaining flags are FALSE,
(3) the correlation arc fault flag, the correlation arc override flag, and the ML no arc override flags are TRUE and the remaining flags are FALSE,
(4) the correlation arc fault flag and the correlation arc override flags are both TRUE and the remaining flags are FALSE,
(5) the correlation arc fault flag is TRUE and the remaining flags are FALSE, and
(6) the ML arc fault flag and the ML arc override flags are both TRUE and the remaining flags are FALSE.

As shown in FIG. 13, some entries in truth table 1302 are missing (represented by an 'X'). Missing entries are a result of mutually exclusive conditions being present and/or conditions being present that render the values of particular flags to be meaningless. For example, in the first row of truth table 1302, data entries for the ML no arc override, correlation arc override, and ML arc override flags are all marked 'X' because the combined arc fault, the correlation arc fault, and the ML arc fault flags are all FALSE.

In some embodiments, the controller 310 is configured to determine arcing is present when one or more of the following conditions is met. In some embodiments, the controller 310 determines arcing is present when the ML arc fault flag is set. In some embodiments, the controller 310 determines arcing is present when both the ML arc fault flag is set and the correlation arc fault flag is set. In some embodiments, the controller 310 determines that arcing is present when at least one of the correlation arc override flags is set and the ML arc override flag is set. In some embodiments, the controller determines whether arcing is present based on the arcing probability calculated in block 1155. In such embodiments, the controller 310 may be configured to determine arcing is present when the arcing probability exceeds a threshold, such as the arc fault present threshold.

Referring again to operation 1100, if the controller determines that arcing is present at block 1180, the controller 310 is configured to activate interrupting device 210 to separate the line terminals 220, 225 from the load terminals 230, 235 (block 1185). If the controller 310 determines that arcing is not present at block 1180, the operation 1100 returns to block 1105.

As described above, the controller 310 is configured to execute a machine learning model 1000 that is used for detecting the presence of an arc fault. In some embodiments, the machine learning model 1000 is created using an external computing device, such as external device 635. In such embodiments, the machine learning model 1000 is stored in memory 620 of controller 310 after creation. However, in other embodiments, the machine learning model 1000 is created by controller 310.

Figure 14:
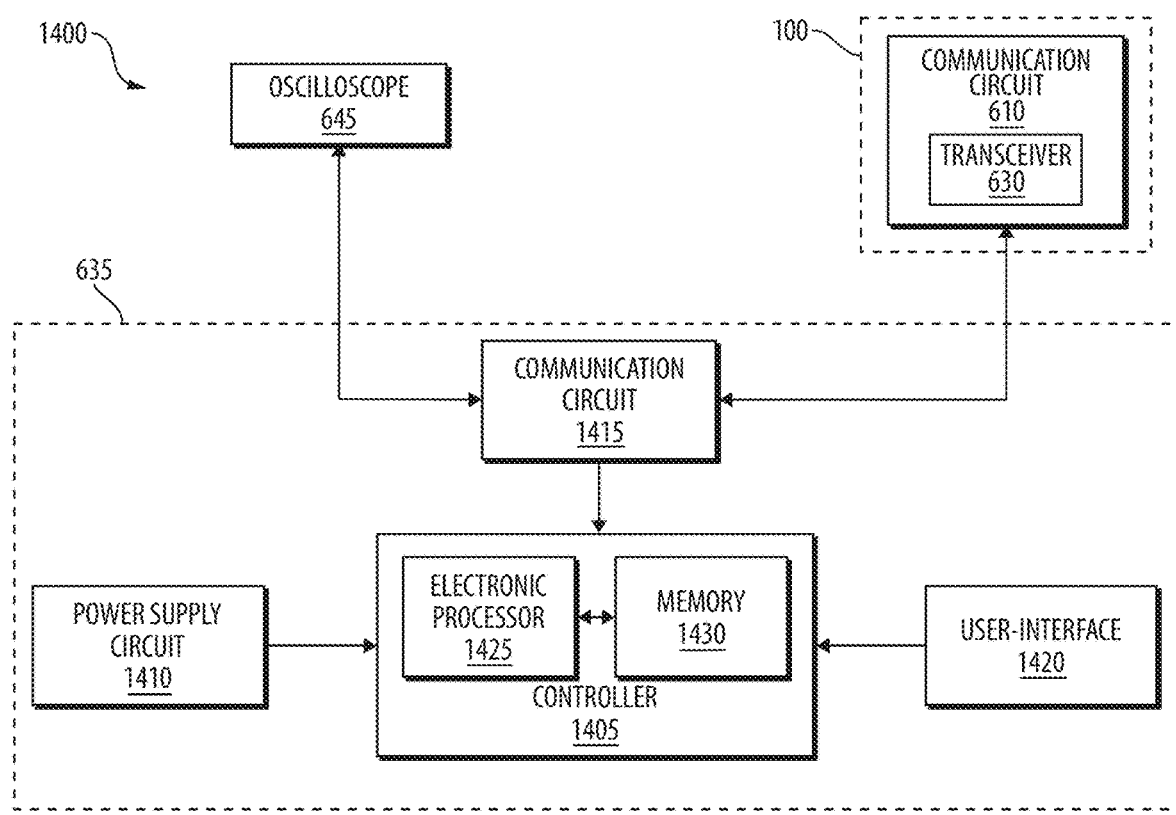
FIG. 14 illustrates a block diagram of a control system of an external device illustrated in FIG. 6, according to some embodiments.

FIG. 14 is a block diagram of a control system 1400 of the external device 635 used to create machine learning model 1000. As described above, the external device 635 may be implemented as one or more of, a computer terminal, a desktop, a laptop, a smartphone, a tablet, a server, or any other electronic device that includes a memory and an electronic processor capable of training a machine learning model.

As shown, the control system 1400 of the external device 635 includes a controller 1405. The controller 1405 is electrically and/or communicatively connected to a variety of modules or electronic components of the external device 635. For example, the controller 1405 is connected to a power supply circuit 1410, a communication circuit 1415, and a user-interface 1420.

The controller 1405 includes a plurality of electrical and electronic components that provide power, operational control, and protection to the components and modules within the controller 1405 and/or the external device. For example, the controller includes, among other things, an electronic processor 1425 and a memory 1430.

The memory 1430 includes, for example, a program storage area and a data storage area. The program storage area and the data storage area can include combinations of different types of memory, such as read-only memory (ROM) and random access memory (RAM). Various non-transitory computer readable media, for example, magnetic, optical, physical, or electronic memory may be used. The electronic processor 1425 is communicatively coupled to the memory 1430 and executes software instructions that are stored in the memory 1430, or stored in another non-transitory computer readable medium such as another memory or a disc. The software may include one or more applications, program data, filters, rules, one or more program modules, and other executable instructions. For example, the software includes one or more programs for training machine learning models.

The power supply circuit 1410 is configured to supply power to the controller 1405 and/or other components of the external device 635. In some embodiments, the power supply circuit 1410 receives power from a power source (e.g., a battery) and provides regulated power to the controller 1405 and/or other components of the external device 635. In some constructions, the power supply circuit 1410 includes DC-DC converters, AC-DC converters, DC-AC converters, and/or AC-AC converters. In some embodiments, the power supply circuit 1410 receives power from an AC power source (for example, an AC power outlet).

The communication circuit 1415 enables the external device 635 to communicate with the communication circuit 610 of AFCI receptacle 100 and the oscilloscope 645. In some embodiments, the communication circuit 1415 wirelessly communicates with the communication circuit 610 of AFCI receptacle 100 and/or oscilloscope 645. In some embodiments, the communication circuit 1415 uses a wired connection to communicate with the AFCI receptacle 100 and/or oscilloscope 645. In some embodiments, the communication circuit 1415 is capable of both wireless and wired communication with the communication circuit 610 of AFCI receptacle 100 and oscilloscope 645. In some embodiments, the communication circuit 1415 includes, for example, a transceiver that includes and/or is coupled to an antenna. In some embodiments, the communication circuit 1415 includes a port configured to receive a wired connection.

In some embodiments, the communication circuit 1415 communicates with the communication circuit 610 of AFCI receptacle 100 and/or the oscilloscope 645 using a network. The network is, for example, a wide area network (WAN) (e.g., the Internet, a TCP/IP based network, a cellular network, such as, for example, a Global System for Mobile Communications [GSM] network, a General Packet Radio Service [GPRS] network, a Code Division Multiple Access [CDMA] network, an Evolution-Data Optimized [EV-DO] network, an Enhanced Data Rates for GSM Evolution [EDGE] network, a 3GSM network, a 4GSM network, a Digital Enhanced Cordless Telecommunications [DECT] network, a Digital AMPS [IS-136/TDMA] network, or an Integrated Digital Enhanced Network [iDEN] network, etc.). In other embodiments, the network is, for example, a local area network (LAN), a neighborhood area network (NAN), a home area network (HAN), or personal area network (PAN) employing any of a variety of communications protocols, such as Wi-Fi, Bluetooth, ZigBee, etc. In yet another embodiment, the network includes one or more of a wide area network (WAN), a local area network (LAN), a neighborhood area network (NAN), a home area network (HAN), or personal area network (PAN). In some embodiments, the communication circuit 1415 communicates using a wired connection.

The user-interface 1420 is configured to receive input from a user and/or output information to the user concerning the AFCI receptacle 100 and/or the machine learning model 1000. The user-interface 1420 includes a display (for example, a primary display, a secondary display, etc.) and/or input devices (for example, a keyboard, a touch-screen display, a plurality of knobs, dials, switches, buttons, etc.). The display may be, for example, a liquid crystal display ("LCD"), a light-emitting diode ("LED") display, an organic LED ("OLED") display, an electroluminescent display ("ELD"), a surface-conduction electron-emitter display ("SED"), a field emission display ("FED"), a thin-film transistor ("TFT") LCD, etc.

Figure 15:
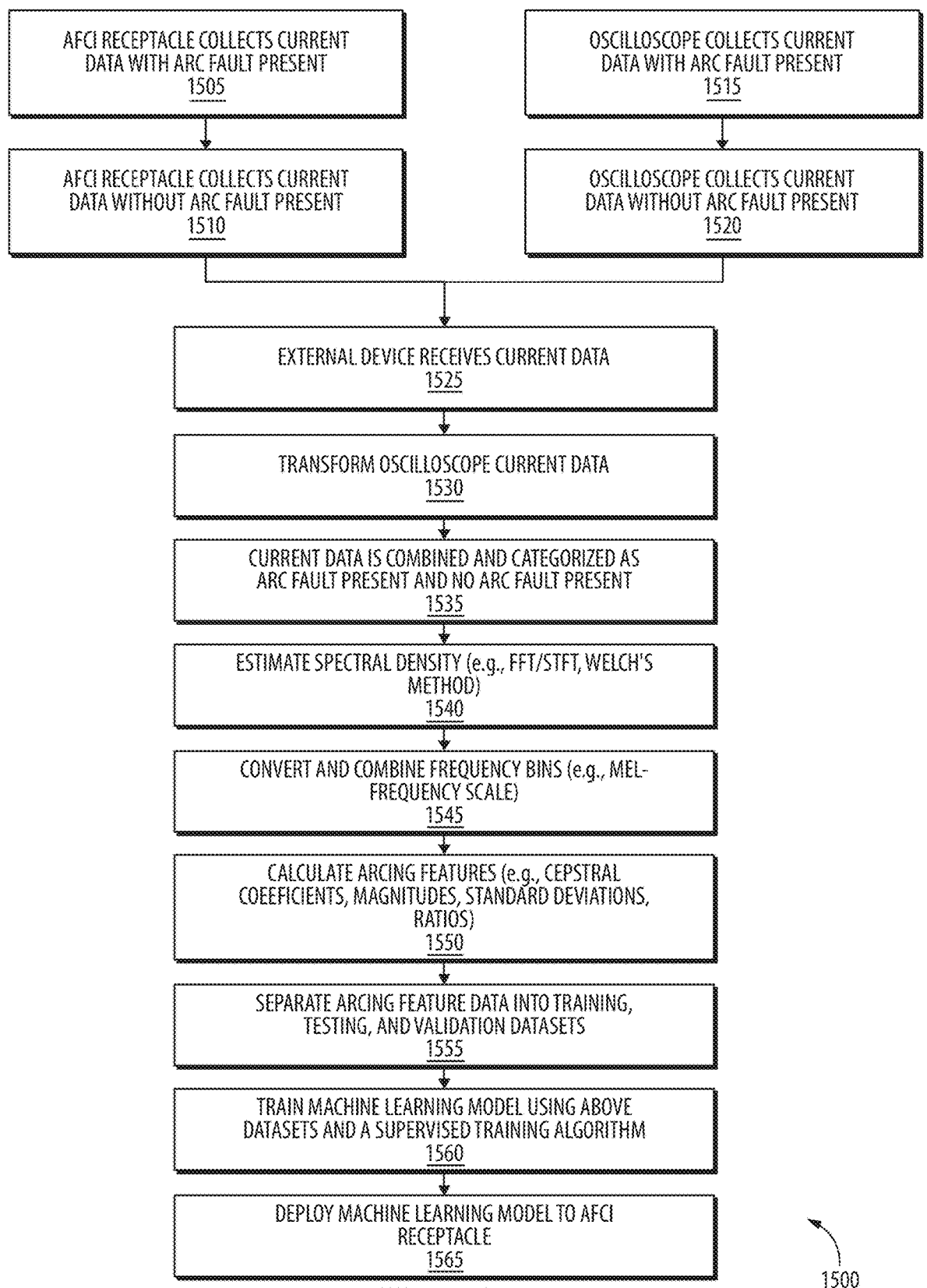
FIG. 15 is a flowchart illustrating a process, or operation, for creating a machine learning model, according to some embodiments.

FIG. 15 illustrates a process, or operation, 1500 for creating an arc fault detection machine learning model, such as machine learning model 1000. Although operation 1500 is described as being performed in part by controller 1405 of external device 635, operation 1500 may also be performed by the controller 310, the controller included in arc fault detection circuit 530, and/or a combination of the external device 635, the controller 310, the controller included arc fault detection circuit 530, and one or more other components included in control system 600. It should be understood that the order of the steps disclosed in operation 1500 could vary. For example, although illustrated as occurring in serial order, in other embodiments, the steps disclosed may be performed in parallel order. Furthermore, in some embodiments, additional steps may be added to the process.

At block 1505, the AFCI receptacle 100 measures the line-side current, voltage, and/or frequency when it is known that an arcing condition is present (e.g., during the occurrence of an arc fault). In some embodiments, the AFCI receptacle 100 measures the load-side current, voltage, and frequency when it is known that an arcing condition is present, instead. In some embodiments, the AFCI receptacle 100 measures both the line-side and the load-side current, voltage, and/or frequency when it is known that an arcing condition is present. In some embodiments, the electrical characteristics are measured by the arc fault detection circuit 530 and/or the zero cross detection circuit 602 included in AFCI receptacle 100. In some embodiments, the arcing condition is created by adjusting one or more components of the AFCI receptacle 100.

At block 1510, the AFCI receptacle 100 measures the line-side current, voltage, and/or frequency when it is known that no arcing is occurring (e.g., when no arc fault is present). In some embodiments, the AFCI receptacle 100 measures the load-side current, voltage, and frequency when it is known that no arcing condition is present, instead. In some embodiments, the AFCI receptacle 100 measures both the line-side and the load-side current, voltage, and/or frequency when it is known that no arcing condition is present. In some embodiments, the electrical characteristics are measured by the arc fault detection circuit 530 and/or the zero cross detection circuit 602 included in AFCI receptacle 100.

At block 1515, the oscilloscope 645 measures the line-side current, voltage, and/or frequency when it is known that an arcing condition is present (e.g., during the occurrence of an arc fault). In some embodiments, the oscilloscope 645 measures the load-side current, voltage, and frequency when it is known that an arcing condition is present, instead. In some embodiments, the oscilloscope 645 measures both the line-side and the load-side current, voltage, and/or frequency when it is known that an arcing condition is present. In some embodiments, the arcing condition is created by adjusting one or more components of the AFCI receptacle 100.

At block 1520, the oscilloscope 645 measures the line-side current, voltage, and/or frequency when it is known that no arcing is occurring (e.g., when no arc fault is present). In some embodiments, the oscilloscope 645 measures the load-side current, voltage, and frequency when it is known that no arcing condition is present, instead. In some embodiments, the oscilloscope 645 measures both the line-side and the load-side current, voltage, and/or frequency when it is known that no arcing condition is present.

At block 1525, the external device 635 receives, via communication circuit 1415, the current, voltage, and/or frequency measurements from the AFCI receptacle 100 and the oscilloscope 645. That is, the AFCI receptacle 100 transmits, via the communication circuit 610, the current, voltage, and/or frequency measurements that were taken while arcing was present (block 1505) and the current, voltage, and/or frequency measurements that were taken while arcing was not present (block 1510) to the external device 635. In some embodiments, the AFCI receptacle 100 wirelessly transmits the measurements to external device 635. In other embodiments, the AFCI receptacle 100 transmits the measurements to external device 635 using a wired connection. Similarly, the oscilloscope 645 transmits, via the communication circuit 610, the current, voltage, and/or frequency measurements that were taken while arcing was present (block 1515) and the current, voltage, and/or frequency measurements that were taken while arcing was not present (block 1520) to the external device 635. In some embodiments, the oscilloscope 645 wirelessly transmits the measurements to external device 635. In other embodiments, the oscilloscope 645 transmits the measurements to external device 635 using a wired connection.

Although operation 1500 includes measuring electrical characteristics of arcing and non-arcing current with both the AFCI receptacle 100 and the oscilloscope 645, it should be understood that in some embodiments, only one device is used to measure the electrical characteristics of arcing and non-arcing current. For example, in some embodiments, only an oscilloscope 645 is used to measure current, voltage, and/or frequency during arcing and non-arcing conditions. Similarly, in some embodiments, only the AFCI receptacle 100 is used to measure current, voltage, and/or frequency during arcing and non-arcing conditions.

At block 1530, controller 1405 of the external device 635 applies transforms and/or filters to the current, voltage, and/or frequency measurements received from oscilloscope 645. Accordingly, the oscilloscope measurements are adjusted to resemble measurements taken by an AFCI receptacle.

At block 1535, the controller 1405 combines the current, voltage, and/or frequency measurements taken by oscilloscope 645 with the measurements taken by the AFCI receptacle 100. In particular, the controller 1405 combines the measurements taken by oscilloscope 645 during an arcing condition with the measurements taken by AFCI receptacle 100 during an arcing condition. Similarly, the controller 1405 combines the measurements taken by oscilloscope 645 when no arcing condition is present with the measurements taken by AFCI receptacle 100 when no arcing condition is present. The arc fault present measurements, or data, are kept separate from the no arc fault present data during the following calculation steps.

At block 1540, controller 1405 estimates the spectral densities of the current measurements taken during an arcing condition and current measurements taken during a non-arcing condition. of the line current. As described above with respect to the operations 700 and 1100, the controller 1405 may be configured to use Welch's Method or Short Time Fourier Transforms for calculating the current spectral densities.

At block 1545, the controller 1405 is configured to convert and combine frequency bins of the arcing and non-arcing current spectral densities using a Mel-Frequency conversion scale, or some other conversion scale. As described above with respect to operations 700 and 1100, combining or converting the current spectral density to the Mel-Frequency Scale or some other scale reduces the amount of data that needs to be processed by controller 1405.

At block 1550, the controller 1405 calculates one or more arcing features, or characteristics, associated with spectral densities of the arcing current and the non-arcing current. As described above with respect to operations 700 and 1100, these arcing characteristics include, but are not limited to, Cepstral Coefficients, spectral density magnitudes indicative of load power volatility, standard deviations of the line current spectral density, and frequency bin magnitude ratios. These arcing features may be calculated using the same or similar methods as described above with respect to operations 700 and 1100.

At block 1555, the controller 1405 is configured to separate both the arcing features of arcing current and the arcing features of non-arcing current into training, testing, and validation datasets.

At block 1560, the controller 1405 executes a supervised training algorithm to train the machine learning model 1000. Training the machine learning model 1000 includes developing one or more thresholds, weights, and/or biases based on the arcing current and non-arcing current data sets. For example, one or more of the thresholds described above with respect to operations 1100 and 1200 (e.g., the arc fault present threshold, the arc fault count threshold, the arc fault override threshold, the no arc override threshold, the no arc clear threshold, etc.) during training, testing, validation, or creation, of the machine learning model 1000.

After the machine learning model 1000 is trained, or created, the controller 1405 deploys the machine learning model 1000 to AFCI receptacle 100 (block 1565). In some embodiments, the controller 1405 wirelessly deploys, using communication circuit 1415, the machine learning model 1000 to AFCI receptacle 100. In some embodiments, the controller 1405 deploys the machine learning model 1000 to AFCI receptacle 100 using a wired connection. In some embodiments, the controller 310 of AFCI receptacle 100 stores the machine learning model 1000 in memory 620 upon deployment of the machine learning model 1000.

In some embodiments, the controller 1405 of external device 635 is configured to update the machine learning model 1000. In such embodiments, the controller 1405 of external device 635 is configured to repeat operation 1500 such that an updated version of the machine learning model 1000. That is, the AFCI receptacle 100 is deployed with an updated version of machine learning model 1000 that includes updated value for the one or more thresholds, weights, and/or biases used for detecting the presence of an arc fault. In some embodiments, the controller 1405 is configured to periodically (e.g., daily, weekly, monthly, etc.) repeat operation 1500. In some embodiments, the controller 1405 is configured to repeat operation 1500 on an on-demand basis.

Figure 16:
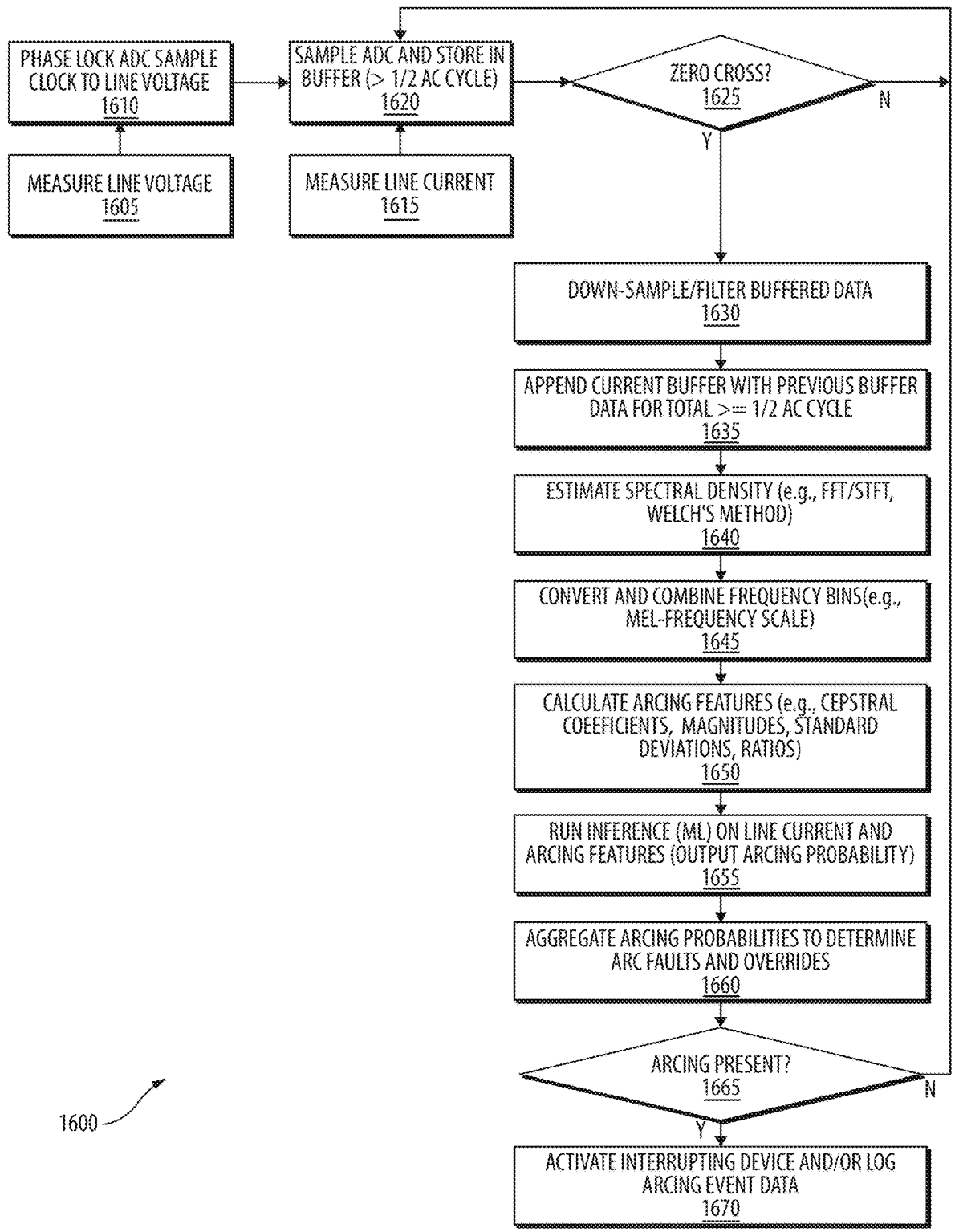
FIG. 16 is a flowchart illustrating a process, or operation, for detecting an arc fault, according to some embodiments.

FIG. 16 illustrates a machine learning-based process, or operation, 1600 for detecting the presence of an arc fault within the AFCI receptacle 100 and/or the circuit to which the AFCI receptacle 100 is connected that is similar to operation 1100 described above, according to some embodiments. As shown in FIG. 16, operation 1600 includes many of the same steps as operation 1100; however, operation 1600 does not include any steps related to a correlation-based arc fault detection method. That is, operation 1600 includes all of the steps from operation 1100 except for any steps related to a correlation-based arc fault detection method. For example, operation 1600 includes every step from operation 1100 except for performing a correlation-based arc fault detection method (block 1165), outputting the results of the correlation-based arc fault detection method (block 1170) and combining correlation-based arc fault detection outputs with ML-based arc fault detection outputs (block 1175).

In addition, since no correlation-based arc fault detection outputs are generated during operation 1600, the controller 310 is configured to determine whether arcing is present based on the aggregated arcing probabilities output by the ML-based arc fault detection method, and not any outputs from a correlation-based arc fault detection method (block 1165). Accordingly, at block 1165, controller 310 may be configured to determine whether arcing is present based on one or more of the status of the ML arc fault flag, the ML arc fault override flag, and the ML no arc override flag. For example, in some embodiments, the controller 1310 determines that arcing is present when the ML arc fault flag is set. In some embodiments, the controller 1310 determines that arcing is present when the ML arc fault flag is set and/or the ML arc fault override flag is set. In some embodiments, the controller 310 is configured to determine that arcing is not present when the ML no arc override flag is set. In some embodiments, the controller 310 is configured to determine that arcing is present when the probability output at block 1655 exceeds a threshold. In some embodiments, the controller 310 is configured to determine that arcing is not present when the probability output at block 1655 is less than a threshold.

Although operation 1600 is described as being performed in part by controller 310, operation 1600 may also be performed by the controller included in arc fault detection circuit 530 and/or a combination of the controller 310, the controller included arc fault detection circuit 530, and one or more other components included in control system 600. It should be understood that the order of the steps disclosed in operation 1600 could vary. For example, although illustrated as occurring in serial order, in other embodiments, the steps disclosed may be performed in parallel order. Furthermore, in some embodiments, additional steps may be added to the process.

What is claimed is:

1. A circuit interrupting device comprising:
   a line terminal;
   a wideband current sensor configured to measure a current flowing through the line terminal;
   a zero cross detection circuit configured to measure a voltage and a frequency of the line terminal;
   a microcontroller including an electronic processor, the microcontroller configured to:
      apply a digital filter to a line current measurement signal received from the wideband current sensor;
      estimate the spectral density of the filtered line current measurement signal;
      calculate an arcing characteristic based on the spectral density;
      determine whether an arc fault is present within the circuit interrupting device based on a comparison of the arcing characteristic to one or more thresholds; and
      activate an interrupting device when an arc fault is present;
   a first printed circuit board configured to support the microcontroller; and
   a second printed circuit board configured to support the wideband current sensor and a second microcontroller.

2. The circuit interrupting device of claim 1, wherein the threshold is determined by a machine learning model stored in a memory of the microcontroller.

3. The circuit interrupting device of claim 1, wherein the characteristic is one selected from the group consisting of a magnitude, a standard deviation characteristic, a cepstral coefficient characteristic, and a frequency bin magnitude ratio.

4. The circuit interrupting device of claim 1, wherein the microcontroller is configured to estimate the spectral density by applying a Short Time Fourier Transform to the filtered line current measurement signal.

5. The circuit interrupting device of claim 1, wherein the microcontroller is further configured to synchronize an analog-to-digital conversion (ADC) rate of the line current measurement signal with the frequency measured by the zero cross detection circuit.

6. The circuit interrupting device of claim 1, further comprising a first printed circuit board configured to support the microcontroller and the wideband current sensor.

7. The circuit interrupting device of claim 1, wherein the wideband current sensor is a Rogowski coil embedded in or connected to a printed circuit board of the circuit interrupting device.

8. The circuit interrupting device of claim 1, wherein the microcontroller is further configured to calculate a probability of an arc fault occurring based on the arcing characteristic.

9. The circuit interrupting device of claim 1, wherein the microcontroller is further configured to calculate a standard deviation of a magnitude of the spectral density, wherein that standard deviation is indicative of volatility in power.

10. A method of detecting presence of an arc fault occurring within a circuit including a line terminal, the method comprising:
    measuring, with a wideband current sensor, a current flowing through the line terminal;
    applying, via a microcontroller including an electronic processor, a digital filter to a line current measurement signal received from the wideband current sensor;
    estimating, via the microcontroller, a spectral density of the filtered line current measurement signal;
    calculating, via the microcontroller, an arcing characteristic based on the spectral density;
    determining, via the microcontroller, whether an arc fault is present within the circuit based on a comparison of the arcing characteristic to one or more thresholds; and
    activating, via the microcontroller, an interrupting device when an arc fault is present;
    wherein the microcontroller is supported by a first printed circuit board and the wideband current sensor is supported by a second printed circuit board.

11. The method of claim 10 further comprising determining, by the microcontroller, a probability of an arc fault occurrence.

12. The method of claim 10, wherein the arcing characteristic is one selected from a group consisting of a magnitude, a standard deviation characteristic, a cepstral coefficient characteristic, and a frequency bin magnitude ratio.

13. The method of claim 10, wherein estimating the spectral density of the filtered line current measurement signal includes applying a Short Time Fourier Transform to filtered line current measurement signal.

14. The method of claim 10 further comprising synchronizing, by the microcontroller, an analog-to-digital conversion (ADC) rate of the line current measurement signal with a frequency measured by a zero cross detection circuit included in the circuit interrupting device.

15. The method of claim 10, wherein the microcontroller and the wideband current sensor are supported by a first printed circuit board.

16. The method of claim 10, wherein the wideband current sensor is a Rogowski coil.

17. The method of claim 10 further comprising executing, by the microcontroller, a machine learning model configured to estimate a probability of an arc fault occurring based on the spectral density.

18. The method of claim 10 further comprising calculating a standard deviation of the magnitude of the spectral density, wherein that standard deviation is indicative of volatility in power.

19. A system comprising:
a circuit interrupting device including:
a line terminal;
a wideband current sensor configured to measure a current flowing through the line terminal; and
a communication circuit configured to wirelessly transmit a signal including current measurements taken by the wideband current sensor; and
an external device including:
a second communication circuit configured to wirelessly receive the signal; and
a controller including an electronic processor configured to:
estimate a spectral density of the current measurements;
calculate at least one arcing characteristic associated with the spectral density;
develop a machine learning model based on the spectral density and at least one arcing characteristic; and
deploy the machine learning model to the circuit interrupting device.

20. A method of deploying a machine learning model to a circuit interrupting device, the method including:
receiving, via a communication circuit, a first set of line current measurements that were taken when an arc fault was present;
receiving, via the communication circuit, a second set of line current measurements that were taken when an arc fault is not present;
estimating, via a controller including an electronic processor, a first spectral density of the first set of line current measurements;

estimating, via the controller, a second spectral density of the second set of line current measurements;
calculating, via the controller, a first set of arcing features associated with the first spectral density;
calculating, via the controller, a second set of non-arcing features associated with the second spectral density;
executing, via the controller, a training algorithm to create the machine learning model based on the first set of arcing features and the second set of non-arcing features; and
deploying the machine learning model to the circuit interrupting device.

21. A circuit interrupting device comprising:
a line terminal;
a wideband current sensor configured to measure a current flowing through the line terminal;
a microcontroller including an electronic processor, the microcontroller configured to:
estimate a spectral density of a line current measurement taken by the wideband current sensor;
calculate an arcing feature based on the spectral density;
calculate, by executing an inference algorithm, a probability of an arc fault occurring based on the arcing feature and the spectral density;
set a first flag when the probability exceeds a threshold for a first amount of time; and
activate an interrupting device when the first flag is set.

22. A method of detecting presence of an arc fault occurring within a circuit including a line terminal, the method comprising:
measuring, with a wideband current sensor, a current flowing through the line terminal;
estimating, via a microcontroller having an electronic processor, a spectral density of a line current measurement signal generated by the wideband current sensor;
calculating, via the microcontroller, an arcing feature based on the spectral density;
calculating, via executing an inference algorithm, a probability of an arc fault occurring based on the arcing feature and the spectral density;
setting a first flag when the probability exceeds a threshold for a first amount of time; and
activating an interrupting device when the first flag is set.

* * * * *